(12) United States Patent
Lodder et al.

(10) Patent No.: US 11,776,825 B2
(45) Date of Patent: *Oct. 3, 2023

(54) CHAMBER FOR DEGASSING SUBSTRATES

(71) Applicant: Evatec AG, Trubbach (CH)

(72) Inventors: Rogier Lodder, Wangs (CH); Martin Schafer, Sargans (CH); Jurgen Weichart, Balzers (LI)

(73) Assignee: EVATEC AG, Trubbach (CH)

( * ) Notice: Subject to any disclaimer, the term of this patent is extended or adjusted under 35 U.S.C. 154(b) by 173 days.

This patent is subject to a terminal disclaimer.

(21) Appl. No.: 16/083,123

(22) PCT Filed: Mar. 8, 2016

(86) PCT No.: PCT/EP2016/054909
§ 371 (c)(1),
(2) Date: Sep. 7, 2018

(87) PCT Pub. No.: WO2017/152958
PCT Pub. Date: Sep. 14, 2017

(65) Prior Publication Data
US 2019/0096715 A1 Mar. 28, 2019

(51) Int. Cl.
*H01L 21/67* (2006.01)
*H01L 21/673* (2006.01)
(Continued)

(52) U.S. Cl.
CPC ...... *H01L 21/67109* (2013.01); *F27D 5/0037* (2013.01); *F27D 9/00* (2013.01); *H01L 21/67178* (2013.01); *H01L 21/67303* (2013.01); *H01L 21/67309* (2013.01); *C23C 14/5806* (2013.01); *F27D 2009/007* (2013.01)

(58) Field of Classification Search
CPC combination set(s) only.
See application file for complete search history.

(56) References Cited

U.S. PATENT DOCUMENTS

| 3,656,454 | A | 4/1972 | Schrader |
| 5,607,009 | A | 3/1997 | Turner et al. |

(Continued)

FOREIGN PATENT DOCUMENTS

| FR | 2747112 A1 | 10/1997 |
| JP | 2766774 B2 | 6/1998 |

(Continued)

OTHER PUBLICATIONS

International Search Report for PCT/EP2016/054909 dated Oct. 20, 2016.
Written Opinion for PCT/EP2016/054909 dated Oct. 20, 2016.

*Primary Examiner* — Jeffrie R Lund
*Assistant Examiner* — Tiffany Z Nuckols
(74) *Attorney, Agent, or Firm* — Pearne & Gordon LLP

(57) ABSTRACT

A heater and/or cooler chamber includes a heat storage block or chunk. In the block a multitude of parallel, stacked slit pockets are each dimensioned to accommodate a single plate shaped workpiece. Workpiece handling openings of the slit pockets are freed and respectively covered by a door arrangement. The slit pockets are tailored to snugly surround the plate shaped workpieces therein so as to establish an efficient heat transfer between the heat storage block or chunk and the workpieces to be cooled or heated.

33 Claims, 14 Drawing Sheets

(51) Int. Cl.
*F27D 5/00* (2006.01)
*F27D 9/00* (2006.01)
*C23C 14/58* (2006.01)

(56) References Cited

U.S. PATENT DOCUMENTS

| | | | |
|---|---|---|---|
| 5,674,786 A | 10/1997 | Turner et al. | |
| 6,025,602 A * | 2/2000 | Rose | H01J 27/14 |
| | | | 250/492.21 |
| 6,497,734 B1 | 12/2002 | Barber et al. | |
| 6,602,348 B1 | 8/2003 | Rogelstad | |
| 6,698,718 B2 * | 3/2004 | Yoo | F16K 5/0407 |
| | | | 251/181 |
| 7,090,741 B2 | 8/2006 | Narushima et al. | |
| 7,381,052 B2 | 6/2008 | Zhao et al. | |
| 7,431,585 B2 | 10/2008 | Zhao et al. | |
| 9,245,767 B2 | 1/2016 | Francischetti et al. | |
| 9,934,992 B2 * | 4/2018 | Weichart | H01L 21/67178 |
| 10,403,522 B2 * | 9/2019 | Weichart | H01L 21/67098 |
| 10,403,552 B1 * | 9/2019 | Sung | C23C 14/225 |
| 10,580,671 B2 * | 3/2020 | Weichart | H01L 21/67178 |
| 2001/0013161 A1 | 8/2001 | Kitano et al. | |
| 2001/0015074 A1 | 8/2001 | Hosokawa | |
| 2005/0274459 A1 * | 12/2005 | Tanase | F16K 1/24 |
| | | | 156/345.31 |
| 2006/0127067 A1 | 6/2006 | Wintenberger et al. | |
| 2006/0156979 A1 | 7/2006 | Thakur et al. | |
| 2006/0196422 A1 * | 9/2006 | Hiroki | H01L 21/67126 |
| | | | 118/719 |
| 2006/0223233 A1 | 10/2006 | Zhao et al. | |
| 2007/0280816 A1 * | 12/2007 | Kurita | C23C 14/566 |
| | | | 414/806 |
| 2011/0114623 A1 | 5/2011 | Goodman et al. | |
| 2012/0220116 A1 | 8/2012 | Noori et al. | |
| 2012/0285621 A1 * | 11/2012 | Tan | H01J 37/32724 |
| | | | 156/345.31 |
| 2013/0078057 A1 * | 3/2013 | Hofmeister | H01L 21/6719 |
| | | | 414/150 |
| 2014/0271054 A1 * | 9/2014 | Weaver | H01L 21/67201 |
| | | | 414/217.1 |
| 2014/0273404 A1 | 9/2014 | Child et al. | |
| 2015/0069043 A1 | 3/2015 | Francischetti et al. | |
| 2015/0159272 A1 * | 6/2015 | Yoon | H01L 21/67109 |
| | | | 118/725 |
| 2016/0336204 A1 * | 11/2016 | Weichart | H01L 21/67017 |

FOREIGN PATENT DOCUMENTS

| | | | |
|---|---|---|---|
| JP | 2015-056669 A | 3/2015 | |
| JP | 2016-018994 A | 2/2016 | |
| KR | 10-2006-0033234 | 4/2006 | |
| WO | WO-2016092007 A1 * | 6/2016 | H01L 21/67161 |

\* cited by examiner

CHAMBER FOR DEGASSING SUBSTRATES

The present invention resulted from requirements in the technique of workpiece degassing. Nevertheless, these requirements also prevail in more general heat treating techniques, as of heating and cooling techniques of certain types of workpieces. Thus, focusing in the present description somewhat on degassing is not to be interpreted as limiting the scope of the present invention.

Degassing means the removal of gases, especially (i) gases from evaporated liquids like water or (ii) vapors that result from sublimating materials adhering to surfaces or (iii), in vacuum technology, substances that are outgassing from (bulk) material as soon as the surrounding pressure falls below its vapor pressure. In certain vacuum treatment processes, especially vacuum sputter coating processes degassing is an important process step, since residual gases may result in deteriorated adhesion of deposited layers or unwanted by-products in the deposits.

One differentiates between atmospheric and sub-atmospheric degassing. As the term suggests, sub atmospheric degassing takes place in an environment where the surrounding pressure can be lowered below atmospheric pressure.

It is known that degassing can be accelerated by heating the substrates thus enhancing the outgassing rate. This method may however have its limits for certain types of materials (e.g. plastics) or where the result of previous process steps could be (negatively) affected, such as melting solder bumps, warping of substrates or increased unwanted diffusion processes. Pump capacities may be improved to more quickly remove unwanted vapors and gases.

However, the physics of the outgassing process itself remains the main limiting factor. In an inline processing system with a sequence of defined process steps the degassing of a single substrate or more generically, heating of the workpieces become often the determining factor for the throughput. Heating, as e.g. for degassing, is sometimes organized in batches. In other words, a plurality of substrates is being exposed jointly to a heated environment that assists the degassing. Such a batch heater, as e.g. a batch degasser thus also acts as an intermediate storage for substrates Consequently, there is a need for an apparatus for heating, thereby especially for degassing workpieces, as of substrates, for workpieces, as for (highly) outgassing workpieces in a batch to enable longer heat-treatment times without the need to sacrifice throughput in subsequent processes.

The workpieces, especially addressed in the present description and claims, are sheet-shaped, are shaped like a drum-skin in a frame, so-called Taiko's, are band or plate-shaped. They all have a pair of two-dimensionally extended, parallel surfaces and a thickness D perpendicular to the addressed extended surfaces, for which there is valid:

$0.01 \text{ mm} \leq D \leq 5 \text{ mm}.$

The workpieces may have structured or unstructured extended surfaces and may be one- or multi-layered.

In inline processing such workpieces, as e.g. substrates or wafers, there is often also a need for a cooling process step. E.g. after such workpieces have been heated up in previous processing steps, e.g. for degassing, a cooling down process step may be needed before further processing. The same considerations prevail as were addressed above with respect to a heating process step, thereby specifically for degassing. In an inline processing system with a sequence of defined process steps, cooling down of workpieces, e.g. of substrates, may as well become the determining factor for the throughput. Cooling too is sometimes organized in batches. Also for cooling a plurality of workpieces, as e.g. of substrates, they are exposed jointly to cooling down environment before being further treated or handled. Such a batch cooler as well acts as an intermediate storage for the workpieces.

Therefore, there is also a need for an apparatus for cooling workpieces of the addressed types in a batch so as to enable longer cooling times without the need to scarify throughput of the entire process.

Some of the addressed workpieces e.g. substrates, like laminated substrates, polymer matrix substrates with embedded dies (fan-out), substrates on tape, epoxy-based substrates require extended degassing time prior to subsequent vacuum processing, like PVD. A degasser for highly outgassing substrates in a batch is enabling longer outgassing times without the need to sacrifice throughput in the following process sequences, which may be single substrate processes, like in a cluster tool.

Batch degassers are described e.g. in U.S. Pat. Nos. 6,497,734 B1, 7,431,585 B2 and US 20110114623 A1. All these variants address a plurality of individual heater plates for each substrate. The disadvantages of stacked individual heater plates are the high costs and the required space.

It is thus, first specifically with an eye on degassing, a specific objective of the present invention to propose a batch degassing chamber that is efficient and inexpensive in terms of manufacturing, maintenance and operation.

A more generalized objective is to propose a batch heat treatment chamber that is efficient and inexpensive in view of manufacturing, maintenance and operation.

The solution according to the invention is a heater and/or cooler chamber for a batch of more than one of the addressed workpieces, having each a pair of parallel, two dimensionally extended surfaces and a thickness D of $0.01 \text{ mm} \leq D \leq 5 \text{ mm}.$ Such chamber comprises a heat storage block, that may also be called chunk, made of a single metal part or of more than one thermally narrowly coupled metal parts. Such narrowly coupled metal parts behave in common thermally only negligibly different from a same one piece metal block or chunk. The metal may be e.g. aluminum or an alloy thereof.

The block comprises more than one parallel slit-pockets stacked one upon the other, each dimensioned to accommodate one of the workpieces. Each slit-pocket extends along a slit-pocket plane $E_p$, a geometric plane, which is a plane that cuts such slit-pocket in two parts, considered in cross section. The slit planes of the slit-pockets are mutually parallel. For clearness sake a slit-plane $E_p$ is shown in FIG. 1 for a slit-pocket SP in a block B. The geometric plane $E_p$ is shown in dash-dotted lines and being intransparent.

Each slit-pocket has a workpiece support for a workpiece. Especially because in some embodiments gas is flown along the workpiece in the slit-pockets, such workpiece supports are realized with surfaces providing a sufficiently high sliding friction with the workpiece surface. Such workpiece supports may be realized e.g. by short studs with respective surface characteristics or e.g. by pieces of O-ring countersunk in the bottom of the slit-pockets. Each slit-pocket has at least one workpiece handling opening.

Each slit-pocket is tailored to surround a workpiece on its workpiece support in a non-contact, closely spaced manner. This is achieved under consideration of a possible un-plane shape of the workpieces, their thickness D and possible catenary of thin workpieces in that the height h of each of the slit-pockets perpendicular to the slit-pocket planes $E_p$ is $$2.5 \text{ mm} \leq h \leq 50 \text{ mm}.$$

This height h, shown schematically in FIG. 1, prevails along at least 30% of the two-dimensional extent area, in FIG. 1 marked A, of the slit-pockets, parallel to the slit-pocket plane EP. Thereby a good heat exchange from the block to the workpiece or from the workpiece to the block is achieved. In one embodiment the addressed h-range is valid for at least 50% of the addressed area.

This height h may be valid along an area which is up to 100% of the two-dimensional extent area of the slit-pockets parallel to slit-pocket planes. Nevertheless, cutouts for access of a handling robot arm below the workpieces may be provided as will be discussed later, e.g. in such cutouts the height of the slit-pockets may possibly not fall in the addressed range, or may even not be defined if such cutouts are through-cutouts.

The at least one workpiece handling opening of each slit-pocket is operatively connected to a door arrangement which controllably frees and covers the workpiece handling opening. The term "covering" as used in the present description and claims addresses that the respective door arrangement may close the workpiece handling opening in a gas-tight manner or may then still establish a gas leakage from the slit-pocket volume to the surrounding of the block or may just cover the workpiece handling opening with respect to the surrounding of the chamber, e.g. spaced from the workpiece handling opening.

At least one heater and/or cooler interface to the block is provided, e.g. a thermally highly conductive surface-area whereat heater and/or cooler-means or -fluids may be brought in tight thermal contact with the block.

The slit-pockets wherein the workpieces are heat treated are provided within the block, e.g. machined into the block.

Alternatively, the block may be built by multiple metal parts thermally narrowly coupled. Such parts may be tailored drawer-like and stacked one upon the other. These parts are thermally narrowly coupled e.g. by tightening as a staple by means of tightening screws or screw-bolts through the entire staple.

The block is a heat storage block, i.e. acts as a heat reservoir ensuring that, once thermal equilibrium has been reached in the block, the temperature in the slit-pockets is kept substantially constant. Freeing and covering of the workpiece handling openings as well as introducing workpieces of different temperatures into the slit-pockets has negligible effect on the thermal state of the block.

In an embodiment of the chamber according to the invention the chamber comprises a heater and/or cooler arrangement which is provided in or along at least one distinct outer area of the block, such outer area of the block forms then the heater and/or cooler interface of the block.

In an embodiment of the chamber according to the invention, a heater and/or cooler arrangement is provided in or at distinct outer areas of the block which areas face each other. Thus, the block of the chamber becomes in fact interposed between a pair of heater and/or cooler arrangements which, in one embodiment, are extended along the respective surfaces of the block.

In an embodiment of the chamber according to the invention the chamber comprises a gas feed line arrangement, which dispatches in at least some of the slit-pockets or in all of the slit-pockets.

Through such a gas feed line arrangement a gas may be flown over and along the workpieces in the respective slit-pockets. If the chamber is a heater chamber, such gas may be pre-heated so as to shorten heating-up time for the workpieces. If such heater chamber is a degassing chamber, the addressed gas flow, as a flushing gas flow, removes gas components, resulting from workpiece outgassing, out of the slit-pocket.

If the chamber according to the invention is a cooler chamber, in analogy, the established gas flow may be pre-cooled to improve workpiece cooling in the slit-pockets.

The addressed pre-heating or pre-cooling of a gas flown through the gas feed line arrangement may be realized by separate specific gas heating and/or cooling arrangements or by the same heater and/or cooler arrangement provided for respectively heating or cooling of the entire block of the chamber.

Thus, through such a gas feed line arrangement a flushing gas stream may be established through the slit-pockets. The slit-pockets may further be pressurized by a gas so as to improve heat transfer from the slit-pocket to the workpiece or vice versa. The latter is especially exploited when the heat treatment in the block is initiated in a vacuum atmosphere, i.e. workpieces are loaded into the slit-pockets in vacuum atmosphere. Nevertheless, in one embodiment such loading is performed at ambient pressure.

In an embodiment of the chamber according to the invention the slit-pockets, or at least some of the slit-pockets, are substantially gas-tight when the door arrangement covers the workpiece handling opening. In one embodiment each of the pockets or at least some of the pockets are then still provided with a gas outlet.

This is e.g. realized by a desired remaining leakage of the covering door arrangement. Such a gas outlet is e.g. established whenever a gas is to be flown through the slit-pockets, e.g. as a flushing gas for degassing and is to be flown along the workpiece and out of the slit-pockets during thermal treatment.

It is also possible to construct the door arrangement to be able to provide covering selectively i.e. in a gas-tight manner or leaky, e.g. by a respective construction and control of the door arrangement.

In one embodiment of the chamber according to the invention at least some or all slit-pockets are mutually aligned and stacked in a direction perpendicular to the slit-pocket planes. In one embodiment at least some or all the at least one workpiece handling openings of the slit-pockets are as well mutually aligned considered in the addressed direction. Thereby handling of the workpieces to and from the respective slit-pockets by means of handling apparatus is significantly simplified.

Moreover, the fact that at least some or even all the at least one handling openings are aligned i.e. stapled in the addressed direction, significantly simplifies realization of the respective controllable door arrangements.

In one embodiment of the chamber according to the invention at least some of or all neighboring slit-pockets are thermally substantially decoupled: The thermal state of a slit-pocket is substantially uninfluenced by a neighboring slit-pocket which is unloaded from a heat-treated workpiece or loaded with a yet heat-untreated workpiece. In one embodiment of the chamber according to the invention, the slit-pockets are mutually aligned in one direction perpendicular to the slit-pocket planes and neighboring slit-pockets are separated, perpendicular to the slit-pocket planes, by sections of the block which have a thickness d, considered in the direction perpendicular to the slit-pocket planes of $$0.5 \text{ mm} \leq d \leq 10 \text{ mm}.$$

This thickness dimensioning prevails for at least 30% or, in one embodiment, for at least 50% of the extended surface area of the slit-pockets considered parallel to the slit-pocket planes.

The thickness d of block material sections between neighboring slit-pockets defines significantly for the thermal decoupling between neighboring slit-pockets and for the heat flow along the sections towards or from the extended surfaces of the two adjacent workpieces. The smaller that this thickness is selected, the worse is the thermal decoupling and heat flow between neighboring slit-pockets. The larger that this thickness is selected, the better is the mutual thermal decoupling of neighboring slit-pockets but the overall chamber becomes larger for a given number of slit-pockets.

As it is intended to minimize mutual thermal influence between neighboring slit-pockets, one would tailor the addressed thickness of block material as large as possible. Nevertheless and as rising the thickness increases thermal inertia of the addressed section of block material, which leads to increased timespans to reach thermal equilibrium, the addressed range of d is selected to provide an appropriate heat flow, acceptable thermal inertia and thermal decoupling between neighboring slit-pockets as well as an adequate number of slit-pockets in a block of predetermined extent.

In one embodiment of the chamber according to the invention the slit-pockets comprise in their bottom surfaces one or more than one handler cutouts which are accessible from the at least workpiece handler opening of the slit-pockets. Such handler cutouts allow introducing and removing of at least one handling arm of a workpiece handler robot so as to deposit a yet untreated workpiece on the workpiece support or to remove a treated workpiece from the workpiece support and from the slit-pocket. Such cutouts may even be trough-cutouts if too much not restricting heat flow and deteriorating mutual thermal decoupling of neighboring slit-pockets.

In an embodiment of the chamber according to the invention, at least some of the slit-pockets, or all of the slit-pockets, comprise one single workpiece opening.

Especially in the case where such openings are aligned along the block in one direction, workpiece handling is additionally simplified.

In one embodiment of the chamber according to the invention the door arrangement is laid out to controllably cover and free at least one of the workpiece handling openings at the same time. Alternatively and even if only two slit-pockets are provided, more than one of the workpiece handling openings may be simultaneously freed or covered.

According to one embodiment the door arrangement is controllable or controlled to maintain all workpiece handling openings covered during a timespan. This is necessary if e.g. all the slit-pockets are loaded with respective workpieces and heat treatment is not yet terminated for any of these workpieces.

The door arrangement may be realized in different manner. E.g. distinct door-flaps or sliders may be directly mounted to the block adjacent to each of the workpiece handling openings. All of the door-flaps or sliders may be individually opened and closed by one or more than one drives. By controlling the closing-status of the flaps one may establish whether closing is performed in a gas-tight manner or so that a gas flow out of the respective slit-pocket may be established.

In an embodiment of the chamber according to the invention at least some or all of the at least one workpiece handling openings are mutually aligned in one direction along the block. The door arrangement is realized by a door plate with at least one door-workpiece-handling opening, DWHO. The door plate is controllably slidable along and relative to the block in the addressed direction. The at least one DWHO is thereby brought in and out of alignment with at least one of the aligned workpiece handling openings of the slit-pockets.

If more than one DWHO are provided, more than one of the aligned workpiece-handling openings of the respective slit-pockets may simultaneously be freed and covered if, considered in the addressed direction, the spacing between DWHOs accords with the spacing between workpiece-handling openings of the slit-pockets. Even if latter is not the case, providing more than one DWHO shortens the sliding hubs of the door-plate relative to the block to bring a respective DWHO in alignment with a workpiece-handling opening of a slit-pocket.

In one embodiment the door-plate is operationally connected to a plate-drive for the relative sliding. Alternatively or additionally the block is operationally connected to a block-drive. The addressed door-plate may be realized in the latter case by a wall of a casing surrounding the block. Such plate as e.g. the addressed wall may be distant from the surface of the block with the workpiece handling openings, leaving an interspace there between. In an embodiment as practiced today the DWHO in such plate or wall is equipped with a controllably driven flap or slider.

In the embodiments discussed until now, the block, also called chunk, may have a large variety of outer shapes.

In one embodiment of the chamber according to the invention, the block comprises two side faces, e.g. mutually parallel faces, as well as a front face between and linking the side faces. The heater and/or cooler arrangements are located at or in both of the addressed side faces whereas the at least one workpiece handling openings of the slit-pockets are provided in the front face. Thereby separation of block areas, on one hand with the heater and/or cooler arrangement, on the other hand with the handling openings, is realized. The heat flow in the block is established perpendicularly to the direction of loading and unloading workpieces to and from the slit-pockets. This considerably simplifies the overall construction of the chamber.

In one embodiment of the chamber according to the invention the chamber comprises a gas feed line arrangement which dispatches in at least some of the slit-pockets or in all of the slit-pockets. The gas feed line arrangement is operationally thermally connected to a gas heater and/or gas cooler arrangement which is located along a back-face of the block, opposite the addressed front-face. The slit-pockets extend transvers to the addressed side-faces as e.g. perpendicularly thereto.

As the heater and/or cooler arrangements are provided at, i.e. along or in both of the addressed side faces and the slit-pockets extent transversely thereto e.g. perpendicularly thereto, heat current flows along sections of the block between neighboring slit-pockets and thus parallel to the extended surfaces of workpieces on the respective workpiece supports. The addressed sections provide for a good heat transport between the heater/cooler arrangements and the workpieces.

In one embodiment of the chamber according to the invention, the block is located within a thermally isolating housing and is e.g. spaced from the isolating housing. The isolating housing bars heat flow between the block and the surrounding of the chamber.

In one embodiment of the chamber with a thermally isolating housing, the door arrangement comprises one or more than one controllable DWHO in a wall of the isolating housing and opposite to the workpiece handling openings. The block is operatively coupled to a controllable block drive which is constructed to bring one or more than one of the workpiece handling openings into alignment with one or more than one DWHOs. Thus, if for instance two DWHOs are provided in the wall of the isolating housing, either two of the workpiece handling openings may be brought in alignment with the two DWHOs, or just one of the workpiece handling openings may selectively be brought in alignment with one DWHO thereby with an optimized minimal hub of the block. The DWHO in a wall of the isolating housing, distant from the block, are equipped with controllably driven flaps or sliders.

In one further embodiment the workpiece handling openings are ongoingly in flow communication with an interspace between the block and the isolating housing. Thereby and especially if a flushing gas flow is established along the slit-pockets, the gas flow enters in unhindered manner the addressed interspace.

In one further embodiment the addressed housing comprises a pump port to remove the gas from the interspace.

If by means of a gas feedline arrangement dispatching in at least some of the slit-pockets or in all of the slit-pockets a gas flow is established through the slit-pockets, such gas flow also prevents contamination of a slit-pocket once the workpiece handling opening is freed to the surrounding by means of the door arrangement.

In the embodiment just addressed above in which the door arrangement comprises one or more than one DWHOs in the wall of the spaced apart isolating housing, the addressed gas flow prevents ongoingly cross-contamination of the slit-pockets through their open workpiece-handling openings and may additionally lower contamination of the interspace once a DWHO in the wall of the isolating housing is opened as by a controllably driven flap or slider. A part of such gas leaves the interspace through the open DWHO.

In one embodiment the chamber according to the invention comprises a gas feed line arrangement dispatching in at least some of the slit-pockets opposite to one of the at least one workpiece handling openings.

By respectively establishing and controlling the door arrangement a controlled gas flow may be established all along the extended surfaces of the workpiece on the respective workpiece support. The resulting pressure within the addressed slit-pocket may also be controlled by tailoring and respectively controlling the door arrangement, in analogy to providing a controlled pressure stage or valve between the inside of the slit-pocket and the surrounding.

In one embodiment of the chamber according to the invention which again comprises gas feed line arrangement which dispatches in at least some or in all of the slit-pockets, there is provided a gas heater and/or gas cooler arrangement for the gas in the gas feedline arrangement. Thereby, heating up or cooling down workpieces within the slit-pockets may be improved.

Any number or all embodiments of the chamber according to the invention and as were addressed above may be combined if not mutually contradictory.

The present invention is further directed to an apparatus which comprises a chamber according to the present invention and possibly according to one or more than one of the embodiments thereof described above. In such apparatus or system the chamber comprises a gas feed line arrangement dispatching in at least some or in all of the slit-pockets. The gas feed line is operationally connected to a pressurized gas source arrangement for at least one of dried air, of N2, of Ar, of He.

The present invention is further directed to a workpiece treatment system which comprises a chamber or apparatus according to the present invention and possibly according to one or more than one of the embodiments thereof and as was addressed, with the following limitations:
  a) each slit-pockets in the block have a single workpiece handling opening;
  b) the slit-pockets are stacked in an aligned manner in the block and in direction perpendicular to the slit-pocket planes, thus, in most cases, in vertical direction as the slit-pockets in most cases extend along horizontal slit-pocket planes;
  c) the workpiece handling openings of the slit-pockets are aligned along the block and in the addressed direction;
  d) the door arrangement frees the inside of the slit-pockets to ambient atmosphere.

The workpiece treatment system further comprises:
  a vacuum treatment arrangement for the workpieces which comprises a load-lock arrangement between ambient atmosphere and a vacuum atmosphere in the vacuum treatment arrangement;
  a magazine arrangement—comprising at least one magazine—in ambient atmosphere with a multitude of workpiece holders.

The slit-pockets, the workpiece holders of the magazine arrangement and preferably also a workpiece holder arrangement in the load-lock arrangement are all tailored to hold the workpieces with their extended surfaces along parallel planes.

The system further comprises a handling robot in ambient atmosphere which is, in one embodiment, drivingly rotatable about a vertical axis and has at least one radially extendable and retractable handling arm for at least one workpiece.

The handling robot is tailored and controlled to handle workpieces to and from the magazine arrangement, to and from the load-lock arrangement, to and from the chamber. This handling may be realized along one common plane.

Thereby a small footprint, compact system is realized and by means of the handling robot in ambient atmosphere, a fast and flexibly controllable inter-handling of workpieces between the addressed units is feasible. The overall system is most flexibly adaptable to different needs and the number of magazines as well as the overall structure of the vacuum treatment arrangement may flexibly be adapted. The addressed robot may further be exploited to handle workpieces to and from additional stations of the system, e.g. and for specific workpieces, an alignment station, wherein the position of the workpiece is properly set. Such alignment station may be part of the magazine arrangement to properly align the workpieces before that they are conveyed from the magazine arrangement to the chamber.

In one embodiment of the system the handling robot is constructed to handle one single workpiece at the time to and from the magazine arrangement, to and from the load-lock arrangement and to and from the chamber.

In a further embodiment of the system the magazine arrangement comprises more than one, e.g. two distinct magazines, e.g. one input magazine, possibly with an aligner, for workpieces yet not treated by the system, and an output magazine for workpieces having been treated by the system.

In a further embodiment the system comprises a workpiece aligner station as was addressed above, which is also served by the robot.

In a further embodiment the chamber is a heater chamber, thereby especially a degasser chamber, and the vacuum treatment arrangement comprises a cooler station for the workpieces. Such a cooler station might be provided alternatively between the degasser chamber and the load-lock arrangement, thus in ambient atmosphere.

In spite of the fact that the chamber of the system may be a cooler chamber, in one embodiment of the system according to the invention, the addressed chamber is a degasser chamber. In this case workpiece handling occurs from the magazine arrangement, possibly comprising an aligner station, to the degasser chamber, from the degasser chamber to the vacuum treatment arrangement and from the vacuum treatment arrangement back to the magazine arrangement.

If the chamber according to the invention is tailored as a cooling chamber, than, by the addressed system and as an example, the workpieces may be conveyed by the handling robot from the magazine arrangement, possibly with an aligner, to the vacuum treatment arrangement, form the vacuum treatment arrangement to the cooling chamber and from the cooling chamber back to the magazine arrangement.

The present invention is further directed to a method of manufacturing thermally treated workpieces. The method makes use of a chamber or of an apparatus or of a system according to the invention, possibly according to one or more than one of the respective embodiments.

The method comprises first establishing a pre-determined temperature of the block. Then:

(a) A workpiece, as was addressed above, is loaded in at least one of the slit-pockets, and on the respective workpiece support, after having freed a respective workpiece handling opening of the respective slit-pocket by the door arrangement.

Then (b) the respective workpiece handling opening of the slit-pocket, loaded with the workpiece, is covered by the door arrangement and the workpiece is thermally treated in the slit-pocket (c).

Thereafter and after having freed the addressed workpiece handling opening (d) of the slit-pocket by the door arrangement, the thermally treated workpiece is removed through the workpiece handling opening of the slit-pocket (e).

In spite of the fact that in some applications of the method the timespan during which the workpiece is thermally treated might be determined in situ e.g. by monitoring the temperature course of the workpieces e.g. by an arrangement of temperature sensors, in one variant of the method according to the invention, the timespan during which the addressed thermal treatment is to be performed in the slit-pockets is predetermined.

In one variant of the method according to the invention a cycle of the addressed steps (a) to (e) is performed multiple times in different slit-pockets with a time lag between directly subsequent ones of the addressed cycles which time lag is shorter than a timespan for the thermal treatment.

This means for example that a first cycle with the steps (a) to (e) is initiated and performed in a first slit-pocket and before terminating the addresses first cycle thereby especially the thermal treating step (c) a second cycle with steps (a) to (e) is initiated at a second of the slit-pockets.

In a further variant of the method according to the invention loading workpieces into the slit-pocket is performed departing from ambient atmosphere and removing a thermally treated workpiece from the slit-pockets is performed into ambient atmosphere.

In one variant of the method according to the invention a workpiece is conveyed between the chamber according to the invention and a magazine arrangement as well as between the addressed chamber and a vacuum treatment arrangement for vacuum treating the workpiece as well as between the vacuum treatment arrangement and the addressed magazine arrangement. Thus, if a vacuum treatment for the workpiece necessitates degassed workpieces, the workpieces are conveyed from the chamber tailored as a degasser chamber to the vacuum treatment arrangement, are treated in the vacuum treatment arrangement—possibly including a cooling step—and then conveyed from the vacuum treatment arrangement to the magazine arrangement. Thereby the addressed conveyings may be performed directly or via an intermediate station, e.g. an alignment station may be provided ahead loading fresh workpieces to the chamber, i.e. upstream or downstream the magazine arrangement or as a part of the magazine arrangement.

If, for instance, after vacuum treatment of the workpieces the workpieces have to be cooled down, then and as a further example, untreated workpieces are first conveyed from the magazine arrangement directly or via a further station, as e.g. an aligner station, to the vacuum treatment arrangement. Vacuum treated workpieces are then conveyed to the chamber according to the invention tailored as a cooler chamber and from there conveyed to the magazine arrangement. As was addressed above, cooling may also be necessary after the degassing step, e.g. in the vacuum treatment arrangement or between the chamber and the vacuum treatment arrangement.

Further and if according to one embodiment of the invention loading the chamber with workpieces is performed from ambient atmosphere and unloading workpieces from the chamber as well occurs into ambient atmosphere, the addressed vacuum treatment arrangement communicates to ambient via a respective I/O-load-lock arrangement which may be realized by a distinct input (I) loadlock and a distinct output (O) loadlock or by a combined input and output loadlock.

In a further variant of the just addressed variant of the method according to the invention, the addressed conveyings are performed by means of single workpiece conveyings.

According to a variant of the method according to the invention, the chamber comprises a number n of slit-pockets but only a smaller number m thereof is used. This allows to flexibly adapt the overall handling of the chamber to specific needs thereby optimizing on one hand conveying path lengths to and or from the addressed chamber and additionally leaving the thermal state of the chamber as unaffected as possible by respectively loading and unloading of the slit-pockets.

Thereby, in one variant of the just addressed variant, directly subsequent loading of workpieces in the slit-pockets is performed at time intervals dT and each workpiece rests in the chamber during a predetermined time span Δ. The quotient of Δ/dT is rounded to an integer $(\Delta/dT)_I$ and there is valid $m=(\Delta/dT)_I$. Due to this appropriate selection of the number m of used slit-pockets, whenever the last slit-pocket is loaded, the heat treatment of the workpiece in the first loaded slit-pocket is terminated and thus the respective workpiece may be removed from the first loaded slit-pocket. After dT the treatment of the workpiece loaded in second instance is terminated etc. Thus one slit-pocket after the other may cyclically be unloaded and reloaded.

In one embodiment of the method according to the invention the steps (a) to (e) are directly subsequently performed in non-directly neighboring slit-pockets of the chamber. Thereby one achieves that the thermal disturbances upon a neighboring slit-pocket, which is in treatment status, is minimized.

In a further variant of the method according to the invention in which the slit-pockets are stacked one on the other, step (a) is first performed in every second slit-pocket considered in a first direction along the chamber, then the addressed direction is inversed and the addressed step (a) is subsequently performed in every remaining slit-pocket in such inverse direction.

Thus, as an example, first every second slit-pocket is loaded in one propagating direction along the stack of slit-pockets, then propagation direction is inversed and the remaining slit-pockets are loaded.

In analogy, every second slit-pocket is unloaded in one propagation direction, then, at the end of the stack, the propagation direction is again inversed and the remaining slit-pockets are unloaded.

Thereby one and the same slit pocket may be unloaded and reloaded before propagating to the next slit pocket.

Although it is possible, according to the method of the present invention, to load and remove a workpiece through different workpiece handling openings of one slit-pocket, in one variant of the method according to the invention loading a workpiece to and removing a workpiece from the slit-pocket is performed through the same workpiece handling opening of the slit-pocket.

It is absolutely possible according to the method of the invention to load and/or remove simultaneously more than one workpiece to respectively more than one of the slit-pockets. In one variant of the method according to the invention, only one single workpiece is loaded to and/or removed from a slit-pocket at a time, i.e. simultaneously.

In one variant of the method according to the invention at least during the step of thermally treating there is established a flow of a gas along the workpiece and out of the respective slit-pocket.

In a variant of the method according to the invention, the gas establishing the addressed flow along the workpiece is preheated or precooled before the addressed flow of gas along the workpieces is established.

If the chamber according to the invention and in the addressed method is exploited as a degasser chamber, the addressed flow of gas is exploited as a flushing gas flow so as to remove evaporated products from the slit-pockets.

In a further variant of the method according the invention the chamber is provided within a thermally isolating housing. By such thermally isolating housing heat exchange between the block of the chamber and a surrounding of the chamber is minimized.

In a further variant of the method wherein the block of the chamber is provided within a thermally isolating housing at least during thermally treating a workpiece in the slit-pockets a flow of gas is established along the workpieces and out of the slit-pockets into an interspace between the isolating housing and the block and the addressed gas is removed from the interspace preferably by pumping.

In a further embodiment of the method according to the invention the slit-pockets are separated from ambient atmosphere surrounding the housing via at least one controllably closable and openable DWHO of the door arrangement and in the wall of the housing. The block of the chamber is controllably drivingly moved in the housing by a controlled drive so as to align a workpiece handling opening of the slit-pockets and the at least one DWHO in the wall of the housing.

Thereby the workpiece handling openings of the slit-pocket may freely communicate with the interspace between the block and the isolating housing. A gas flow established through the slit-pockets prevents mutual contamination of the slit-pockets by degassed products. The DWHO in the wall of the isolating housing in fact establishes or bars flow communication between the interspace and the surrounding of the housing. The one or more than one DWHOs in the wall of the isolating housing are in a good embodiment equipped with respective flaps or sliders, driven in a controlled manner.

Depending on the respective application it might be desirable to establish in the interspace and with respect to the surrounding atmosphere an overpressure so that even when the DWHO is open, no gas flow is established from the surrounding towards the interspace. Alternatively it might be desired to establish in the interspace a slight under-pressure with respect to the pressure in the surrounding of the housing so as to prevent a gas flow from the interspace to the surrounding when the addressed DWHO is open. Latter may be advisable if, for instance, degassed products conveyed by the gas flows into the interspace are harmful and should not be freed in the surrounding atmosphere which is, in a today practiced variant, ambient atmosphere.

In a further variant of the method according to the invention at least loading of the workpiece is performed in vacuum at a first pressure and the respective slit-pocket loaded with the workpiece is pressurized, during treating the workpiece, to a second pressure which is higher than the first pressure. Thereby heat transfer to or from the workpiece in vacuum is improved.

Any number of all variants of the method according to the invention as addressed above may be combined if not mutually contradictory.

The invention and different aspects thereof shall now further be exemplified with the help of figures.

BRIEF DESCRIPTION OF THE DRAWINGS

FIG. 9b shows a cross-section through the slit-pocket as of FIG. 9a.

The invention will now be further exemplified, somehow focused on degassing, with the help of figures.

Figure 2:
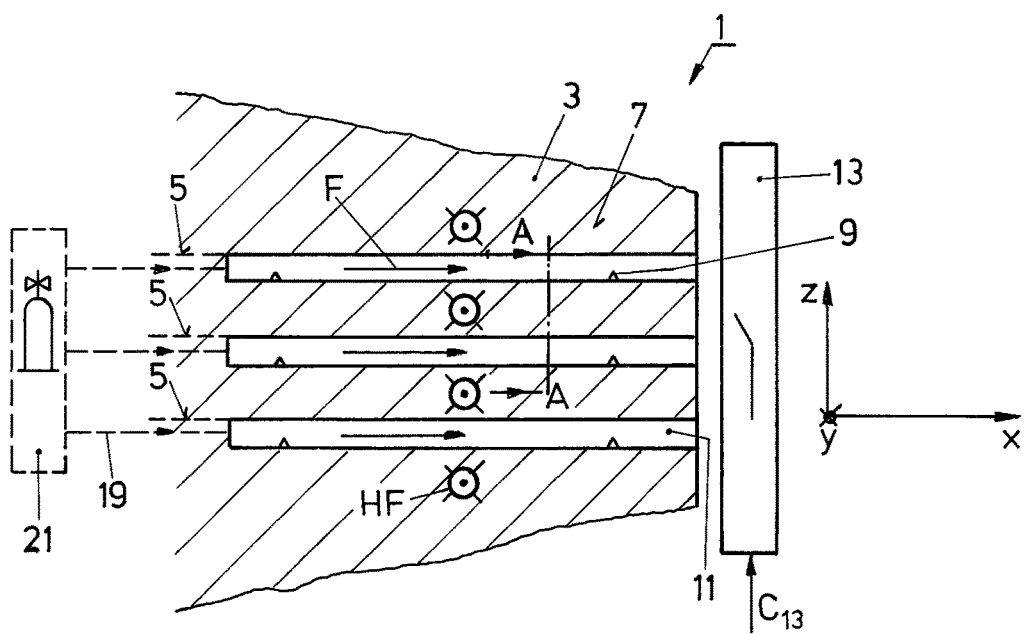
FIG. 2 still in a schematic, simplified representation a cross-section through a block of the chamber according to the invention along the slit-pockets.

FIG. 2 shows, most schematically and simplified, in a cross sectional representation, a part of a block 3 of a chamber 1 according to the invention. Within single piece block 3 of a metal, as of aluminum or of an aluminum alloy, or of a block 3 construed, as shown in dashed lines at 5, of multiple metal parts, mutually biased so as to establish narrowest thermal coupling, e.g. by screws or screw bolts not shown in FIG. 2, slit-pockets 7 are provided. The slit-pockets are mutually parallel and extend along slit-pocket planes E. In the representation according to FIG. 2 the slit-pocket planes $E_p$ are parallel to the x/y plane of the coordinate system x/y/z. The slit-pockets 7 are stacked one upon the other whereby they are not necessarily aligned in y direction. The slit-pockets 7 comprise, as schematically shown, workpiece supports 9 for the workpieces as addressed above, which are not shown in FIG. 2.

The slit-pockets 7 have workpiece-handling openings 11. Whereas, in the embodiment of FIG. 2, each slit-pocket 7 has one single workpiece-handling opening 11, such workpiece-handling opening might additionally be provided at the end of the respective slit-pockets 7, opposite the workpiece-handling opening 11 shown.

The chamber 1 further comprises a door arrangement 13, schematically shown in FIG. 2, for freeing or covering selectively workpiece-handling openings 11 of the slit-pockets 7. As schematically shown in FIG. 2 by control input $C_{13}$ to the door arrangement 13, the door arrangement 13 is controllable with respect to the freeing/covering status of workpiece-handling openings 11.

Figure 3:
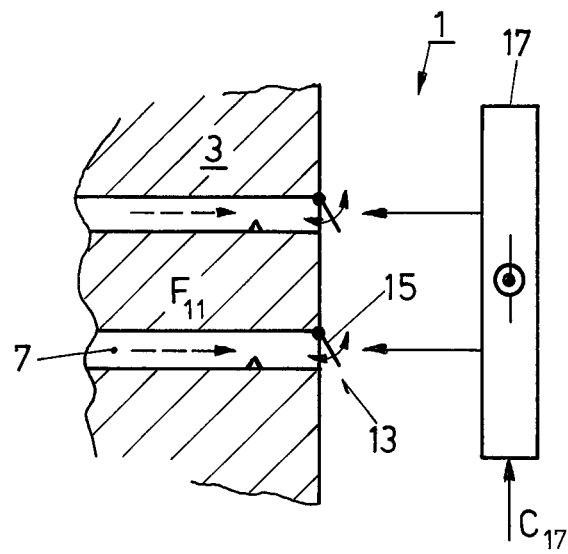
FIG. 3 in a representation in analogy to that of FIG. 2, a first embodiment of realizing a door arrangement as used in the chamber according to the present invention.
Figures 4A, 4B:
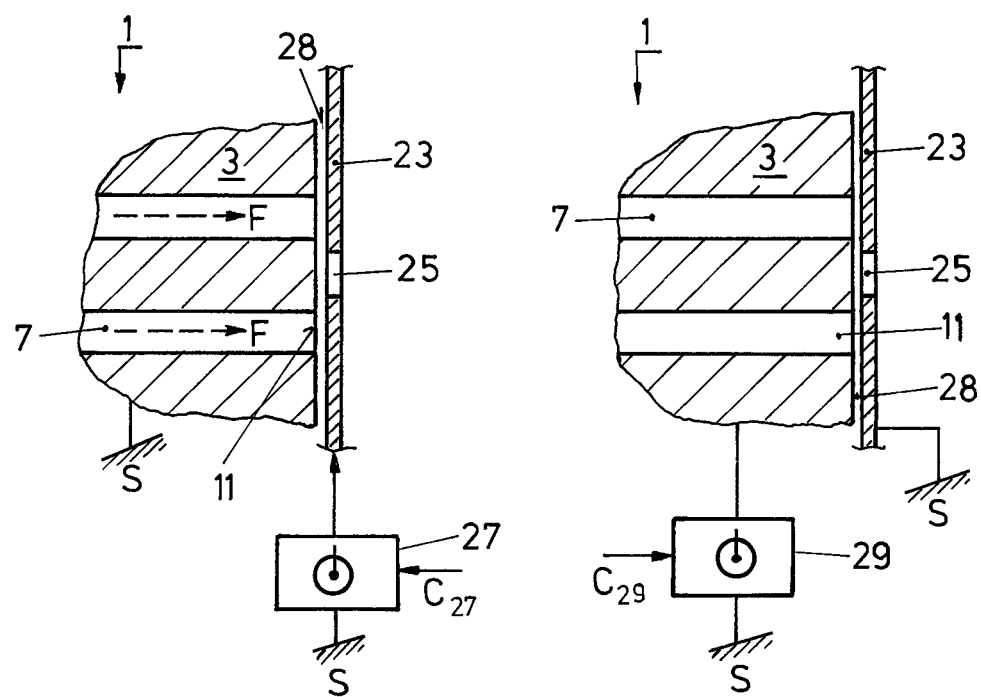
FIG. 4a in a representation in analogy to that of FIG. 3 a further embodiment of realizing the door arrangement.
FIG. 4b still in a representation in analogy to the representations of the FIG. 3 or 4a a further embodiment of realizing the door arrangement.
Figure 5:
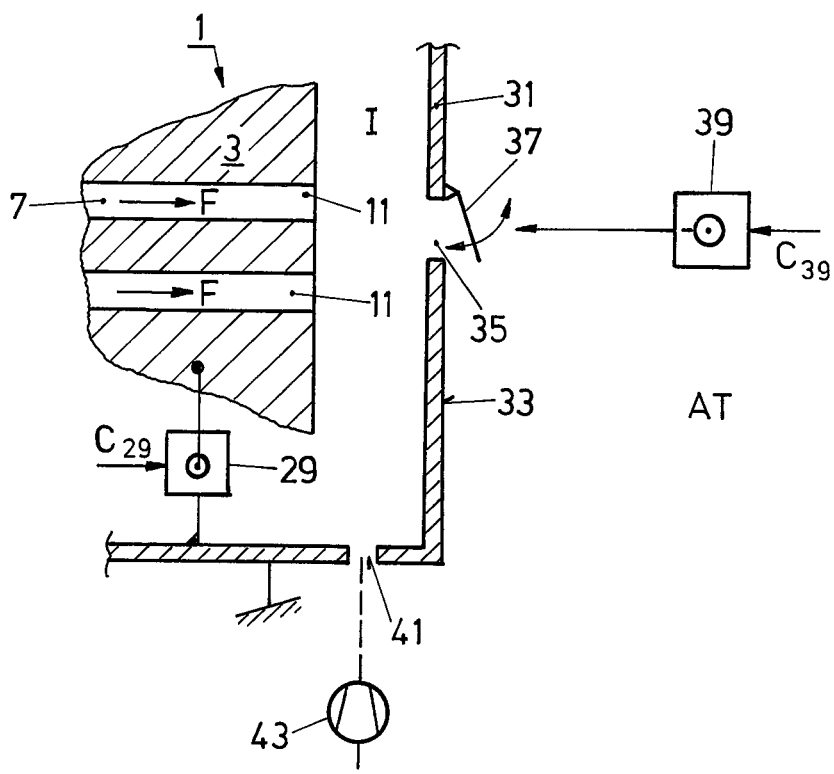
FIG. 5 still in a representation in analogy to that of the FIGS. 3 and 4a, 4b a further, today practiced embodiment of the door arrangement and as provided in the chamber according to the invention.

FIGS. 3 to 5 most schematically and in a representation in analogy to that of FIG. 2 show examples of realizing the door arrangement 13 as of FIG. 2.

According to FIG. 3 the door arrangement 13 comprises a slider (not shown) or a flap 15, pivotably or slidably (not shown) mounted to block 3. Each of the flaps 15 or sliders is driven by a drive unit 17, controlled as shown at control input $C_{17}$.

As shown in FIG. 2 in dashed lines and especially if the chamber 1 is a degasser chamber, gas feed lines 19 discharge in at least some, normally in all slit-pockets 7. The gas feed lines 19 are operationally connected to a pressurized gas source as schematically shown at 21 of FIG. 2.

Back to the embodiment of FIG. 3 and with an eye on establishing a gas flow F along and through the slit-pockets 7 by the gas feed lines 19, especially in an embodiment wherein the chamber 1 is a degasser chamber, the flaps 15 or sliders, in this embodiment, close the workpiece-handling openings 11 either in a gas-tight manner or in a leaky manner establishing a gas outlet for the gas flow F. Whether a flap 15 or slider seals the workpiece-handling openings 11 in a gas-tight manner or only in a leaky manner may be set by the control of drive unit 17.

According to FIG. 4a, the door arrangement 13 as of FIG. 2 is realized by a plate 23 and, as exemplified in FIG. 4a, one DWHO 25. In the example according to FIG. 4a, the plate 23 is operationally connected to a plate drive 27, controlled at $C_{27}$. The plate 23 is drivingly and controllably slid along a surface of block 3 so as to bring the DWHO 25 selectively in alignment with a workpiece-handling opening 11. Between plate 23 and block 3 a gap 28 is defined.

With an eye on an established the gas flow F, there is ongoingly provided a gas outlet between plate 23 and the surface of block 3 through the gap 28.

Departing from the representation of FIG. 4a, FIG. 4b addresses a further embodiment. In this embodiment and as shown also in FIG. 4a by the symbol S, plate 23 with DWHO 25 is kept stationary whereas block 3 with the slit-pockets 7 is operationally connected to a block drive 29, controlled as schematically shown at $C_{29}$. By means of the block drive 29 the block 3 is slid along plate 23 to selectively bring the DWHO 25 in alignment with one of the workpiece-handling openings 11. Here too, the small interspace or gap 28 between the surface of block 3 and plate 23 provides for a gas flow passage from the slit-pockets 7 to the surrounding of the chamber 1. The embodiment according to FIG. 5, again in a simplified and schematic representation in analogy to the representations of FIGS. 3 and 4, in fact departs from the embodiment according to FIG. 4b.It schematically shows an embodiment as practiced today. The plate 23 of FIG. 4b is realized by a wall 31 of an isolating housing 33 which is spaced from the surface of block 3 whereat the workpiece-handling openings 11 are provided. Block 3 is driven by block drive 29, controlled via $C_{29}$, along wall 31 with the DWHO 35. A flap 37 or a slider is movably mounted to the wall 31 so as to close or free the DWHO 35. Thus the door arrangement of wall 31, DWHO 35 and flap 37 or slider either covers the workpiece-handling openings 11 or frees such workpiece-handling openings 11 towards the surrounding atmosphere AT of the chamber 1. This whenever block 3 is driven in a position in which a respective workpiece-handling opening 11 is aligned with the DWHO 35 and the flap 37 or slider is opened. The flap 37 or slider is controllably driven by a drive 39 which is controlled as schematically shown via control input $C_{39}$.

In all embodiments according to FIGS. 4 and 5 the plate or wall may comprise more than one of the DWHO either to free more than one of the workpiece-handling openings 11 simultaneously or to optimize the hub which must be run by the respective plate or by the block to subsequently free workpiece-handling openings 11.

With an eye on FIG. 5 and combined with the embodiment in which a gas flow F according to FIG. 2, e.g. as a degassing flush, is established, the following prevails:

The gas flow F freely exits from the slit-pockets 7 into the interspace I between the wall 31 and the surface of block 3. This prevents cross-contamination of the slit-pockets 7. If such gas flow provides in interspace I a high enough pressure with respect to the pressure in the surrounding AT, it might even be possible to omit a flap 37 or slider.

In one embodiment, as practiced today, there is provided, in the wall of housing 33, a pumping port 41 to be operationally connected to a pump 43.

In the interspace I a pressure may be established which is slightly higher than the pressure in the surrounding AT, which is in practice mostly ambient pressure, so as to establish a gas flow from the interspace I to the surrounding AT whenever the flap 37 or slider frees the DWHO 35. Nevertheless and if the degassed products are harmful and should not be dispatched into the surrounding AT, then the pressure in the interspace I may be selected and controlled to be slightly lower than the pressure in the surrounding AT so as to establish a gas flow from the surrounding AT into the interspace I whenever the flap 37 or slider is open. The gas which is flown through the slit-pockets 7 from pressurized gas source 21 of FIG. 2 may be dried air if the respective workpiece to be treaded is uncritical which respect to oxidation, otherwise at least one of N2, Ar, He.

FIG. 6 shows schematically and simplified a part of a cross-section according to line A-A of FIG. 2 through a part of block 3. The coordinate system as introduced in FIG. 2 is also shown in FIG. 6. Each of the slit-pockets has a height h for which there is valid:

2.5 mm≤h≤50 mm.

Figure 1:
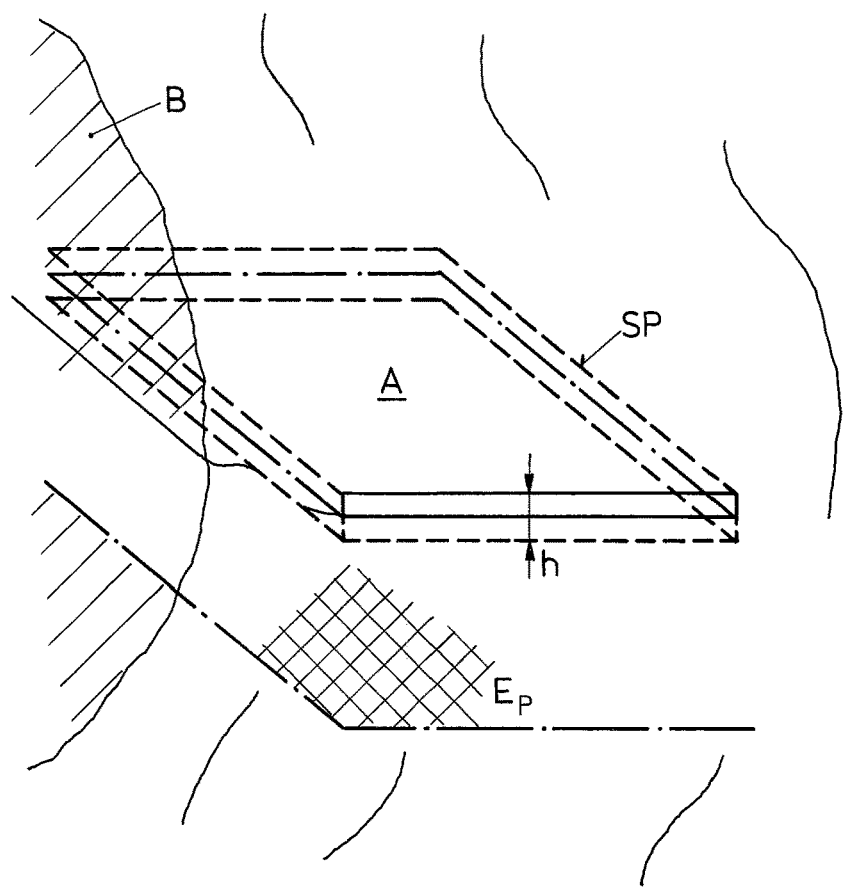
FIG. 1 schematically and in a perspective view a block of a chamber according to the present invention, shown most generically, with a slit-pocket, to explain the definition of the term "slit-pocket plane"

This range of height h prevails for at least 30% or even for at least 50% of the overall surface areas of a slit-pocket 7 along the x/y plane which is parallel to slit-pocket plane $E_p$ according to FIG. 1. In the slit-pockets 7 the workpieces 50 as were addressed in the introductory part of the present description, are supported on workpiece supports 49 which, in the embodiment of FIG. 6, are realized by pieces of O-ring material mounted along the bottom surface of the slit-pocket 7. Thereby the workpiece supports 49 may be constructed in a lot of different variants but it should be made sure that the surface of the workpiece supports which contact the workpieces 50 provide therewith enough friction to ensure stable support of the workpieces 50. The workpieces 50 have a thickness D within the range of:

0.01 mm≤D≤5 mm.

In the bottom surface of the slit-pocket 7 one or more than one cutouts 51 may be worked. Such cutouts 51 may be necessary to allow an arm 53 of a handler, as shown in dashed lines, to enter the slit-pockets 7 beneath the support surfaces of the workpiece supports 49 so as to deposit or remove such workpiece 50.

The sections 52 of the block 3 which separate, in z-direction, directly neighboring slit-pockets 7, are in fact significant with respect to heat flow HF there along, mutual thermal decoupling of neighboring slit-pockets 7, as well as duration for establishing a stable temperature throughout the block 3.

It has been recognized that these sections 52 should have a thickness d for which there is valid:

0.5 mm≤d≤10 mm.

This thickness range d shall prevail along at least 30% or even 50% of the extended surface area of the respective slit-pockets 7 along the slit-pocket plane $E_p$ which is in FIG. 6 parallel to the x/y plane.

If the cutouts fulfill the addressed range for thickness d, they do contribute to the addressed at least 30% of the extent of the slit-pocket surface area to be considered.

The double-arrow I/O schematically represent the movement of the robot arm 53 into and out of slit-pockets 7.

The double arrow F represent the possibly established gas flow.

Figure 6A:
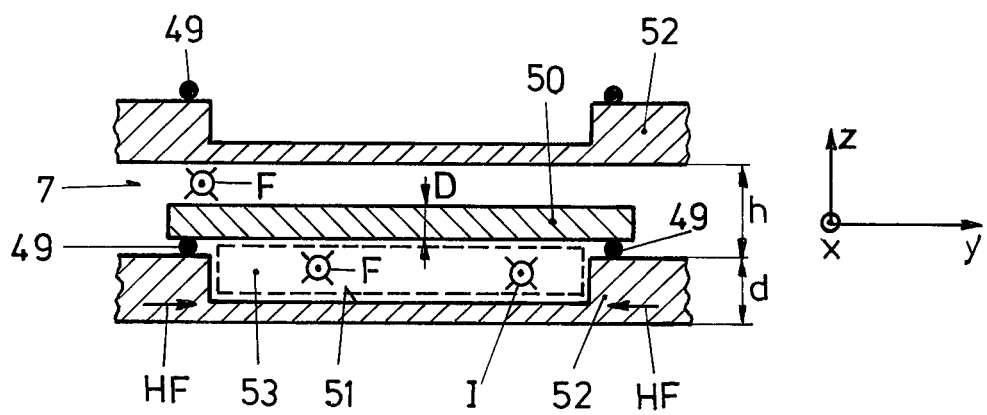
FIG. 6a a simplified cross-sectional view along the dash-dotted lines A-A in FIG. 2 and through a part of a slit-pocket.
Figure 6B:
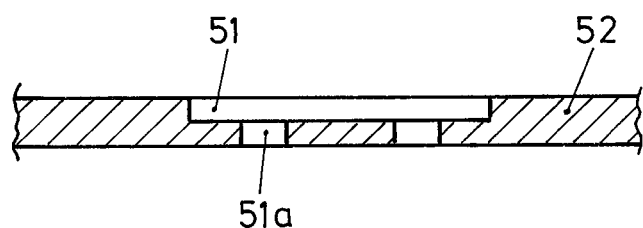
FIG. 6b in a representation in analogy to that of FIG. 6a a further embodiment of possibly structuring the bottom section of a slit-pocket in the chamber according the present invention.

FIG. 6b shows in a representation in analogy to that of FIG. 6a an embodiment in which the section 52 comprises cutouts 51, 51a including through-cutouts as shown at 51a. If the surface area covered by such through-cutouts 51a and their width is small enough they might not substantially negatively influence heat flow, mutual decoupling of directly neighboring slit-pockets 7 and dynamic thermal behavior of the entire block 3.

Figure 7A:
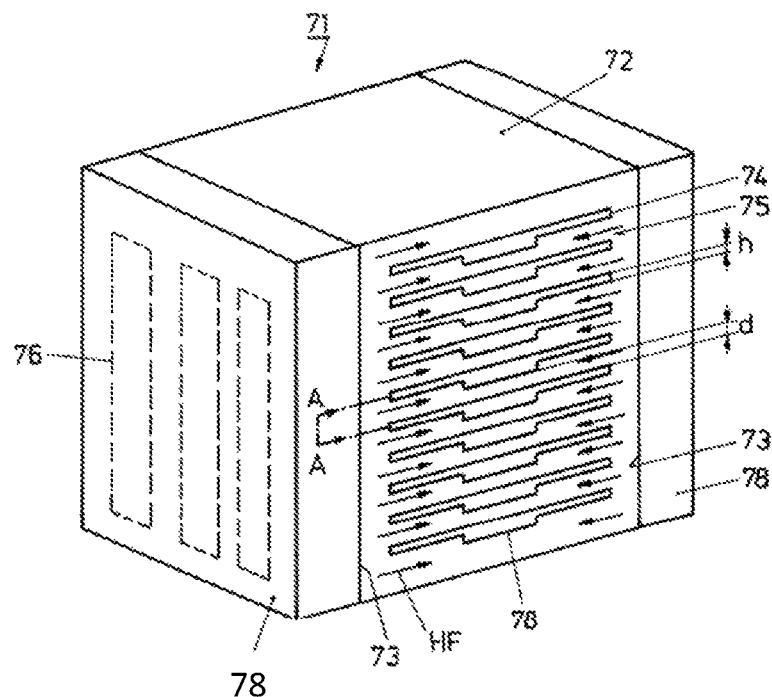
FIG. 7A in perspective view still schematically and simplified an embodiment of the chamber according to the invention.
Figure 7B:
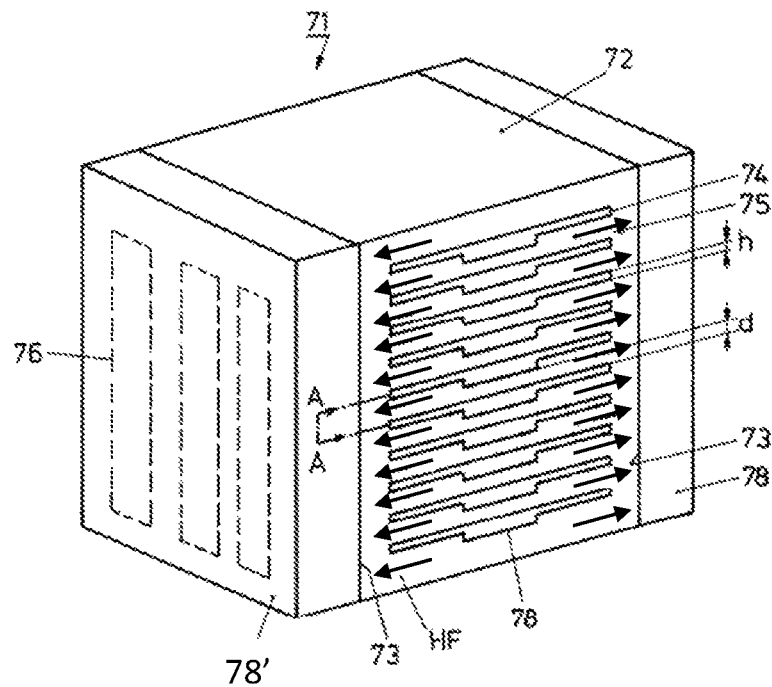
FIG. 7B in perspective view still schematically and another simplified embodiment of the chamber according to the invention.

One embodiment of a batch degasser chamber 71 according to the present invention is shown in FIG. 7. The block of thermally well conductive metal 72 features a plurality of slit-pockets 74. The sections of the block located between two neighboring slit-pockets 2 are labelled 75. The slit-pockets 74 may be machined in a one piece block of the metal or the block 72 is, as was addressed in FIG. 2 at ref.nr.5, assembled from several parts thereby ensuring a thermal behavior of the resulting block 72 which is only negligibly different from a single piece meal block 72. The sections 75 accord with the sections 52 of FIG. 6.

The block 72 is heated by heater elements 76 of heating arrangements 78 on the sidewalls 73 of the block 72. By using the side-walls 73 of block 72 and leaving empty top and bottom faces thereof, a homogeneous temperature profile along all the slit-pockets 74 is achieved.

The heating arrangements 78 with the respective heater elements 76 are biased, as by a multitude of screws (not shown) to the side faces or surfaces 73 of block 72. The arrows HF schematically indicate the heat flow from the heating arrangements 78 through block 72. The lateral or side surfaces 73 of block 72 form, in this embodiment, a heater interface to block 72.

If the addressed chamber with block 72 is tailored as a cooler chamber then the heating arrangements 78 are replaced by cooling arrangements 78' (FIG. 7B) with respective cooling elements, the surfaces 73 become cooler interfaces and the direction of heat flow HF is inversed.

As was already discussed in context with FIG. 6 also in this embodiment of the chamber with block 72, the bottom surfaces of the slit-pockets 74 comprise a central handler cutout 78 for introducing and removing a handling arm, 53 in FIG. 6, beneath the workpiece to be loaded or removed from the respective slit-pockets 74.

Again, if the height h of the slit-pocket 74 with respect to the bottom of the cutouts 78 exceeds the range described in context with FIG. 6a, such cutouts 78 should occupy less than 30% or less than 50% of the overall horizontal extent of slit-pocket 74. Clearly, such cutouts 78 may be only so deep that their areas contribute to that extent of slit-pocket 74 which fulfills the above mentioned range for the height h.

Dependent from the prevailing shape and thickness D of the workpiece 50, the height h is accordingly adapted.

The relation of prevailing workpiece shape and thickness and of the height h of the slit-pockets 74 is selected on one hand so as to optimize heat transfer between the top and bottom walls of the slit-pockets 74 and the workpiece, and, on the other hand, to allow a gas flow F along the extended surfaces of the workpieces 50, if such gas flow is desired. One should consider that the prevailing shape of a workpiece 50 (not shown in FIGS. 7A and 7B) may be due to the workpiece having a certain sagging in the slit-pocket due to its proper weight.

The chamber according to the invention shall be flexibly exploitable for differently tailored workpieces especially with respect to their thickness D and sagging characteristics.

As was addressed, slit-pockets 7, 74 of block 3, 72 shall be mutually thermally decoupled as well as possible so that loading and removing a workpiece 50 to or from one of the slit-pockets 7, 74 does only negligibly influent the directly neighboring slit-pockets in which a workpiece 50 is heat-treated. The thermal intercoupling between neighboring slip-pockets 7, 74 is primarily defined by the thickness of sections 52 (FIG. 6) or 75 (FIGS. 7A and 7B) which mutually separates neighboring slit-pockets 7, 74.

In view of the trend off for dimensioning of the section 52, 75, on one hand, for good mutual thermal decoupling of the slit-pockets 7, 74 and, on the other hand, establishing quick thermal equilibrium upon thermal disturbances and for providing an optimal number of slit-pockets 7, 74 along a given extent or height of the block 3, 72, the thickness d is selected, as was already addressed, to be within the following range:

0.5 mm≤d≤10 mm

Figure 8:
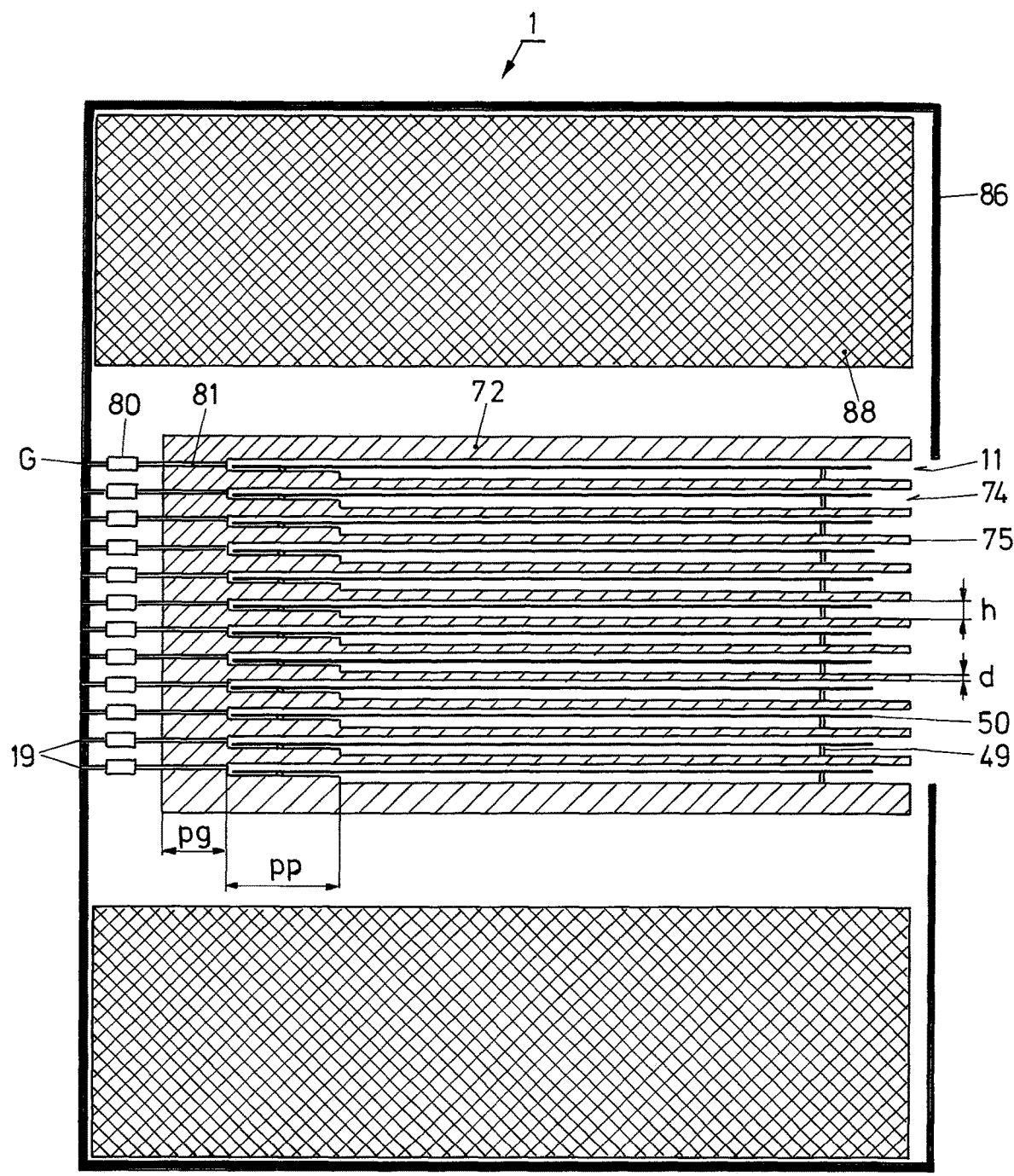
In FIG. 8 shows schematically and simplified a cross-section through an embodiment of a chamber according to the invention with an isolating housing surrounding the block of the chamber.

FIG. 8 shows, simplified and schematically, an embodiment of the batch degasser chamber 1 according to the invention. The workpieces 50 to be heated are positioned on the workpiece supports 49, as on pins, inside the slit-pockets 74. Each of the slit-pockets 74 is preferably gas-supplied via a purge gas line 19 as of FIG. 2, which may be equipped with a filter 80 to avoid particles. The purge gas line 19 may comprise a shallow gas cavity 81 with a length pg intended to preheat the purge- or flush-gas in the heated degasser block 72 before it enters the slit-pockets 74. The gas inlet is arranged preferably in the upper portion of the slit-pockets opposite the workpiece handling openings 11 since it is the goal to achieve a gas flow along the workpieces 50, especially along the top surfaces thereof, where outgassing is especially required.

The batch degasser block 72 is positioned in a housing 86. This housing 86 may include an appropriate isolation 88 to avoid heat loss of the block 72. This concept of a fixed position of the block 72 inside the housing 86 is proposed for a workpiece loading robots with a transfer arm having a large hub or stroke of the vertical drive (z-drive). The maximum number of slit-pockets 74 of the degasser block 72 is then limited by the range of the vertical z-drive-stroke.

Figure 9A:
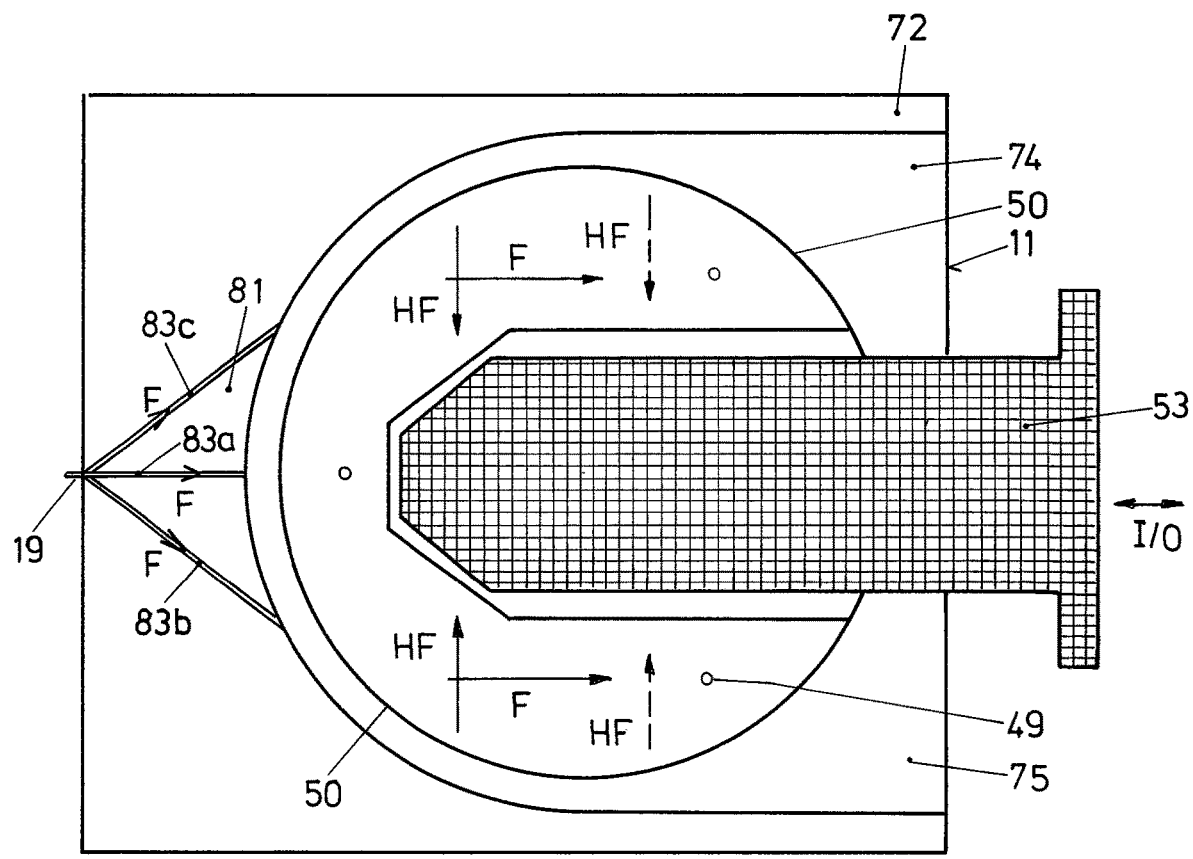
FIG. 9a shows a top-view on a slit-pocket of an embodiment of the chamber according to the invention with a transfer arm of the handling robot.
Figure 9B:
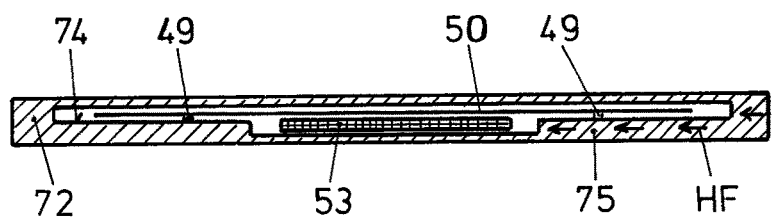

FIGS. 9a and 9b show a top view (a) and a horizontal cross section (b) through a slit-pocket 74 with a workpiece 50 placed on pins 49. The slit-pocket 74 is open to one side by the workpiece-handling opening 11 in order to allow loading and unloading the workpiece 50. On the opposite side the inner contour of the pocket is rounded to match the outer shape of a circular workpiece 50, here a wafer, and thus to enable a good heat transfer inside the block 72. The position of the pins 49 allows a safe operation of the workpiece 50 with the transfer arm 53. The inner contour of the slit-pocket 74 is just machined wide enough to take up the transfer arm 53 and the workpiece during transfer. Consequently the slit-pocket—74—volume is minimized and the spacer section—75—profile is maximized so that the best possible heat transfer is supported. The purge gas line 19 is arranged opposite to the workpiece-handling opening 11. A preheating gas cavity 81 can be a single straight line 83a or a network of distributed lines 83a, b, c.

Figure 10:
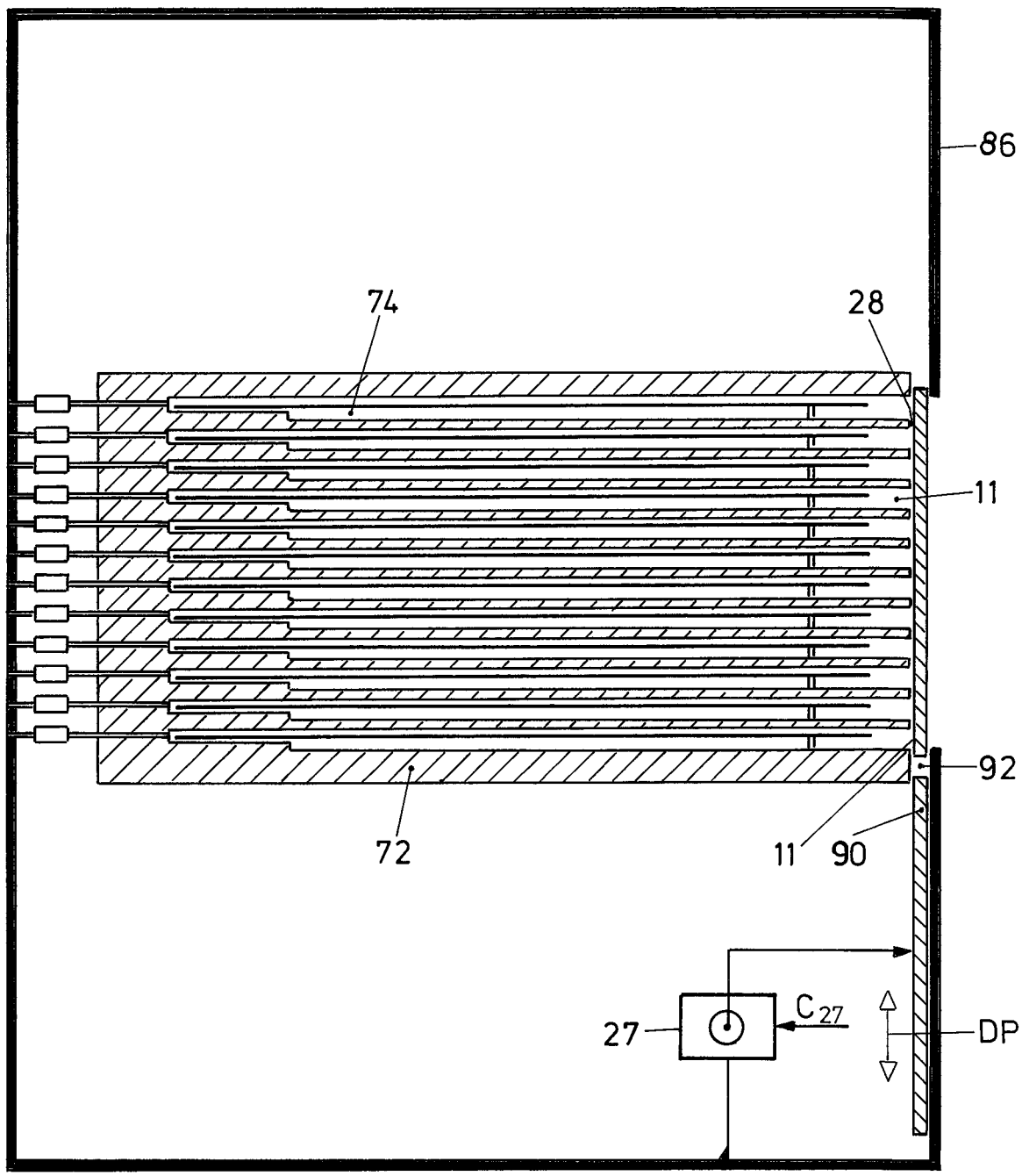
FIG. 10 shows schematically and simplified a cross-section through an embodiment of the chamber according to the invention, the door arrangement comprising a door plate with a door-workpiece-handling opening—DWHO—in closed or covering position.

The embodiment of FIG. 10, shown in a representation analogue to that of FIG. 8, accords principally with the embodiment of FIG. 4a. A door plate 90 has a flat, plate-shaped design of a size essentially twice the size of the front face of the block 72. It exhibits one DWHO 92 of approximately the same shape as the workpiece-handling opening 11, preferably arranged in the middle of the door plate 90 as shown in FIG. 10. The door plate 90 is vertically movable by the drive 27 in directions shown by arrow DP. Between the door plate 90 and the workpiece-handling opening 11 there is the gap 28. In FIG. 10 the door plate 90 is positioned with all slit-pockets 74 closed.

Figure 11:
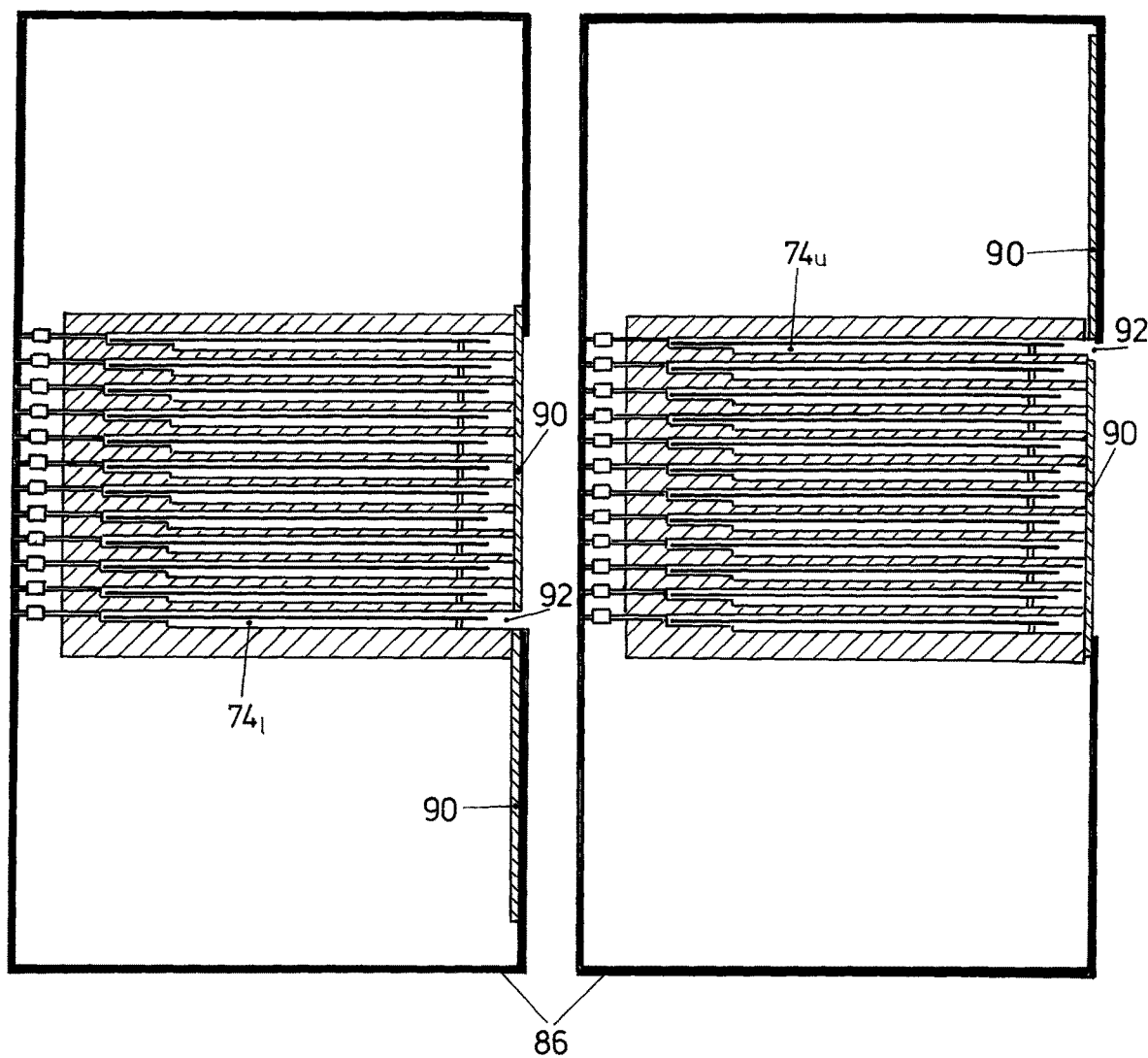
FIG. 11 shows in a representation in analogy to that of FIG. 10 the cross-section through an embodiment of the chamber according to the invention and according to the embodiment of FIG. 10 whereby the door plate frees the lowest slit-pocket (left-hand representation) and the uppermost slit-pocket (right-hand representation).

FIG. 11 shows the door plate 90 being positioned to load or unload a workpiece in the lowest slit-pocket $74_l$ (left) and in the uppermost slit-pocket $74_u$ (right). The door plate 90 allows to keep all slit-pockets 74 closed during a load/unload operation with the exception of the slit-pocket 74 to be accessed. The position can be determined either by means of a sensor or markings or electronically with the aid of a stepper motor as the driven 27.

Figure 12:
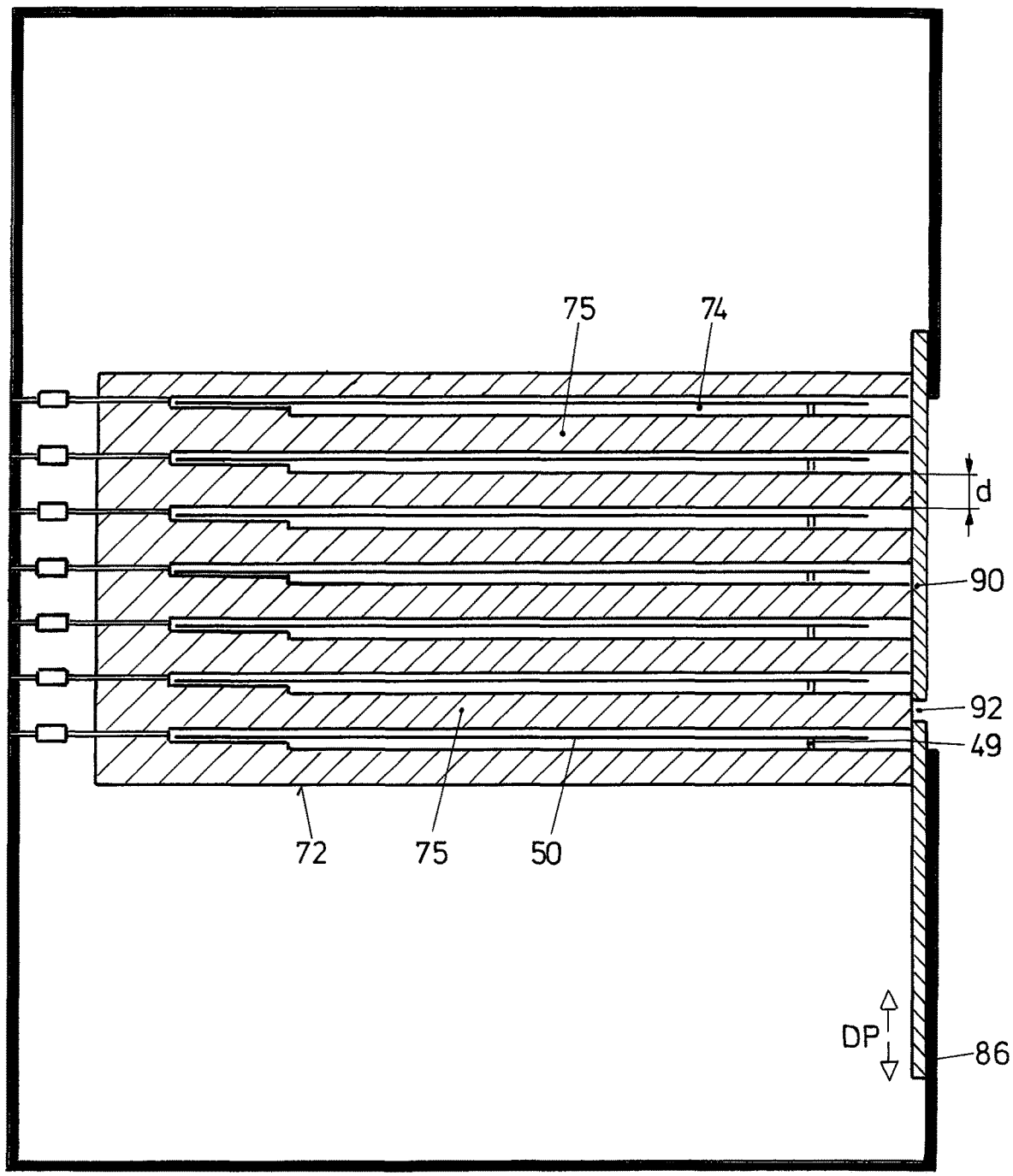
FIG. 12 shows in a representation in analogy to those of FIGS. 10 and 11 a cross-section through an embodiment of the chamber according to the invention, the door plate of the door arrangement covering all workpiece-handling openings of the slit-pockets in a position where the DWHO is in an intermediate position between two neighboring slit-pockets.

An alternative embodiment is shown in FIG. 12 where the spacer sections 75 have such a thickness d that the DWHO 92 in the movable door plate 90 is covered by the front of the spacer sections 75 between two neighboring slit-pockets 74. This has advantages when operating the door plate 90 because there are many "fully closed between pockets" positions (one less than the number of slit-pockets 74). There is however the disadvantage that at a given maximum height of the degasser stack less workpieces 50 can be processed than in the version described above.

Figure 13:
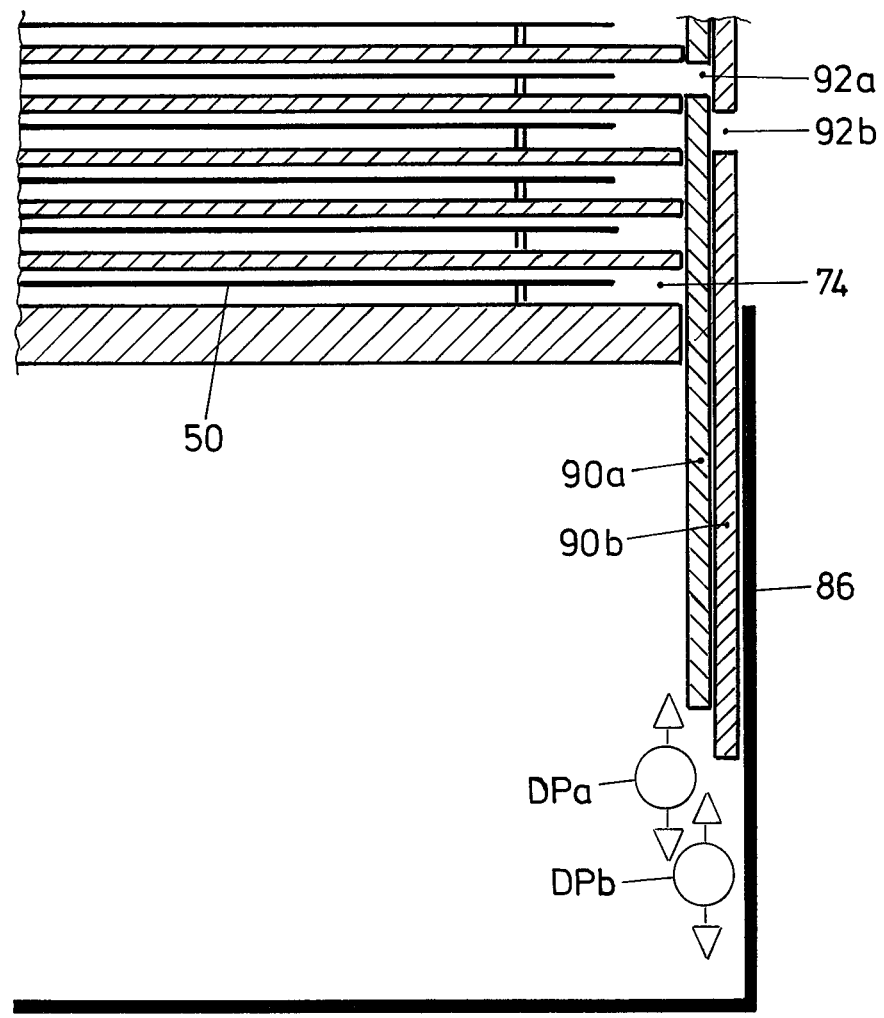
FIG. 13 shows in a representation in analogy to those of the FIGS. 10 to 12 a part of an embodiment of a chamber according to the invention wherein the door arrangement is implemented by two independently driven door plates.

FIG. 13 shows another alternative embodiment with two door plates 90a, 90b independently controllably movable in the direction DPa, DPb. The two DWHO 92a, 92b are offset just so much to have a "closed" configuration. A through-opening DWHO can be quickly realized by aligning both openings 92a, 92b. This solution will allow for better thermal insulation while still allowing a compact arrangement of slit-pockets 74.

For all those embodiments the load operation will comprise:
  Determining an empty slit-pocket inside the degasser block. This can be realized either by a sensor giving a respective (occupied/free) signal or by an electronic controller supervising the status of the slit-pockets. Such a controller could also transmit an "all pockets full" signal to the Load/Unload handling system.
  Giving access to a free slit-pocket by aligning a DWHO with the respective workpiece-handling opening in the block.

Placing a workpiece on a handler capable of performing a z-motion (i.e. vertically in embodiments according to FIGS. 10 to 12) and aligning the handler with the DWHO.

Introducing the workpiece through the DWHO into the slit-pocket 74.

Placing the workpiece on the workpiece supports.

Retracting the handler from the slit-pocket.

Covering the workpiece handling opening of the slit-pocket by the respective door plate.

Figure 14:
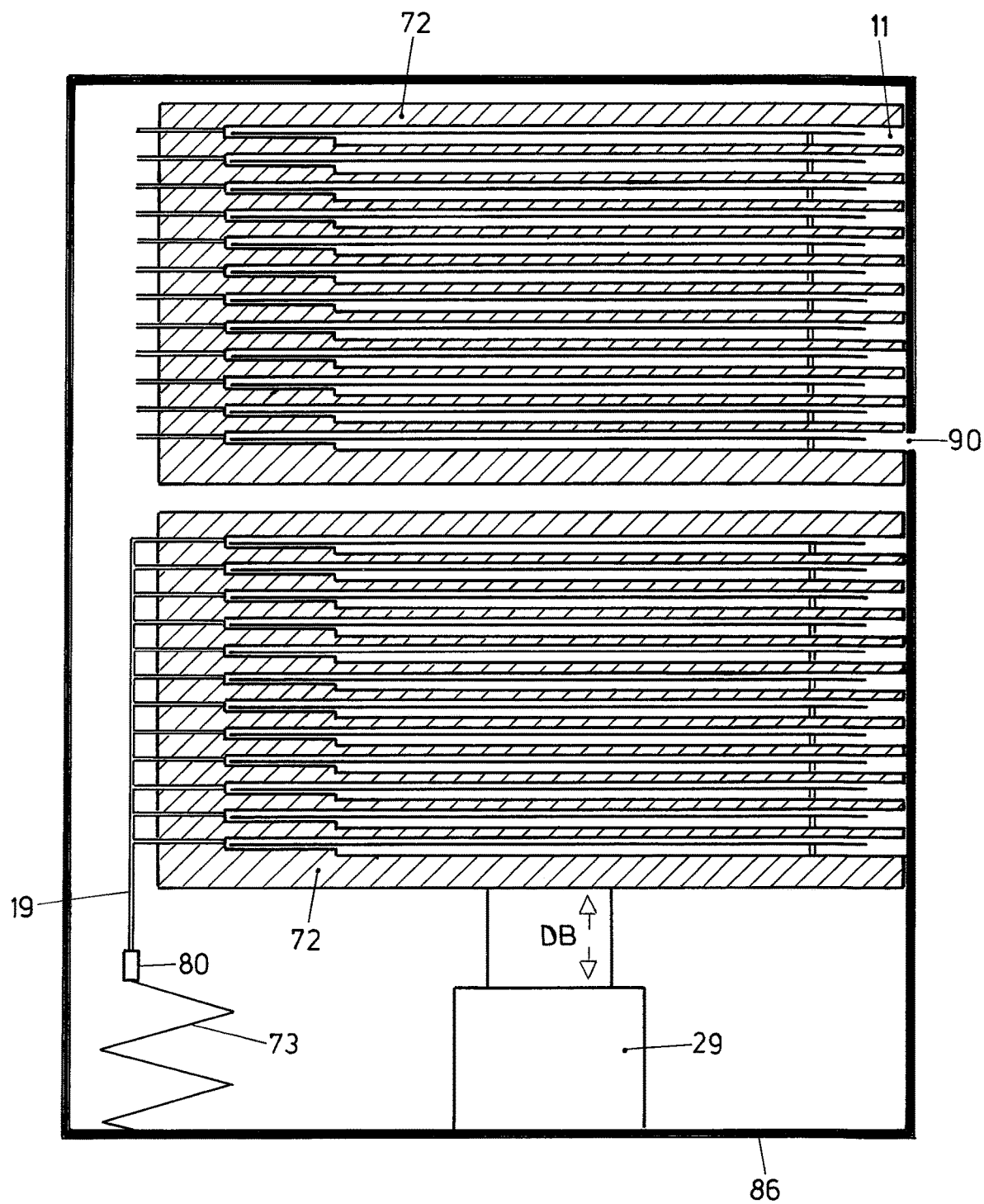
FIG. 14 shows in a representation in analogy to those of the FIGS. 10 to 13 a cross-section through an embodiment of the chamber according to the invention wherein the door arrangement is operated by a driven block and wherein the block is shown in two different positions.

Especially if a transfer arm 53 with a vertical z-drive is not available, an alternative solution—as today practiced—is to vertically move whole block 72 inside the housing 86 by a block drive 29 as shown in FIG. 14). This embodiment principally accords with the embodiment of FIG. 4b or FIG. 5. In this case there is at least one DWHO located at a defined position in the housing 86 which can be also provided with a flap 37 or slider (not shown in FIG. 14) according to FIG. 5, controlled, e.g. by the z-movement of the block 72. FIG. 14 shows the lowered "all-closed" position of block 72 as well as the upper position to load or unload the lowest slit-pocket 74 of the block 72 in the same sketch. The purge gas line 19 has to support the vertical movement of the block 72 by a flexible line 73 prior to the optional gas filter 80. The double-arrow DB shows the movement of block 72 in the housing 86.

The drive(s) for the vertical displacement of the door plates or of the block may be arranged above or below the block and will thus not block any space where the loading and unloading operation takes place.

Figure 15:
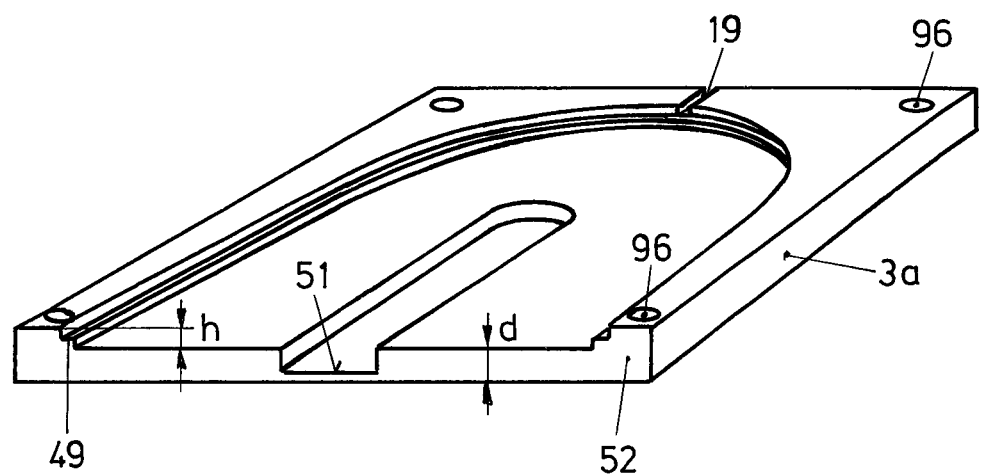
FIG. 15 shows in a perspective view an embodiment of the bottom section of a slit-pocket of a chamber according to the invention.

A further requirement for a batch degasser is that it needs to be cleaned efficiently from time to time. Outgassing material may condense and accumulate at certain cool spots and result in contaminated surfaces, flaking or dust. For a multiple part block 3, as was addressed above and e.g. in context with FIG. 2 at 5, the design of such parts according to FIG. 15 has the advantage of a simplified manufacturing of the slit-pockets 7 and also their easy cleaning. In an Al plate 3a, a cavity is machined from the top, including a cut-out 51 for the transfer arm, an edge 49 as a workpiece support, and the gas inlet 19. The plate 3a has through-holes 96 on all the 4 corners to stack and bias a pile of any number of plates 3a in an easy way. It has to be mentioned that for regular applications with rigid substrates, the cut-out 51 for the transfer arm can be minimized since the transfer arm in atmospheric environment can hold a substrate with a vacuum gripper. In this case, for releasing the substrate no or only a small movement away (downwards in case of FIG. 15) is necessary to allow the retraction of the handler/gripper.

An important feature of the invention is that the block 3, 72 is made of thermally well conducting material. It is advantageous to have block 3, 72 embedded in a housing 31, 86, which supports preserving a uniform temperature profile. Door plates also contribute to this temperature uniformity. As soon as a workpiece is loaded into one of the slit-pockets 7, 74 a temporarily heat drain will occur. Example: To heat up a silicon wafer with 300 mm diameter and 0.77 mm thickness from room temperature to 150° C. requires energy of 11 kJoule. If this energy can be received from a slab of aluminium as the suggested spacer-section 52 with e.g. 320 mm diameter and e.g. 5 mm thickness, the temperature of this section 52 would be reduced by 17° C. However the heat exchange between the workpiece and the spacer-section 52 is relatively slow compared to the heat conductivity within the block 3, 72 so that due to help of the heater elements the block 3, 72 will not experience relevant temperature non-uniformity.

The proposed chamber is preferably run at atmospheric pressure. However the basic ideas may also be applied for low pressure degassing. An effective conductive heat transfer is possible if the gas pressure is >1 kPa.

Nitrogen is the preferred purge or flush gas since it avoids possible oxidation of pre-processed devices on the substrate. The heat conductivity of nitrogen is fairly good (see table below) and it has a low price. Argon or Helium may also be used. Helium has superior heat conductivity, however in this case it may be necessary to keep the leak rate low for cost reasons. On the other hand nitrogen has a better momentum transfer to the molecules to be removed, like water vapor due to similar masses.

$N_2$ 0.026 W/m K

Ar 0.0167 W/m K

He 0.149 W/m K

A process sequence for a batch degasser according to the invention with n pockets may look like the following:

1) Heat the block to a temperature set point, typically 150° C.
2) Position DWHO to the lowest slit-pocket, No. 1
3) Load a workpiece into slit-pocket No. 1
4) Position DWHO in a covering position
5) Adjust a flow of nitrogen to about 50 to 1000 sscm, preferably 100 sscm, in the slit-pocket No. 1

Repeat steps 2 to 5 for slit-pocket No. 2 up to slit-pocket No. n

Unloading will happen as follows, here described for slit-pocket No. 1:

1) Switch off the nitrogen flow in slit-pocket No. 1
2) Position the DWHO to slit-pocket No. 1
3) Unload the workpiece from slit-pocket No. 1 to a vacuum load lock of a vacuum treatment tool. This should happen in the shortest possible time to avoid cool down of the substrate or condensation, unless such cool-down is desired for a subsequent workpiece processing.
4) Load a new workpiece in slit-pocket No. 1

For a continuous processing of workpieces the load/unload sequence is repeated accordingly. The sequences above basically describe a FIFO (first in first out) behavior. However, this may not be necessary when sufficient workpieces in the block have reached a thermal equilibrium, then a random access could be realized also.

The batch chamber according to the invention may incorporate at least one of the following features:

- A compact block made of a material with good heat conductivity with 6 to 50 cut out slit-pockets. The block may be made from a single piece or assembled from individual parts to form one compact block as described above.
- This block is heated from the side walls and may be located in an insulated housing.
- The slit-pockets having a minimal volume for safe workpiece handling in the slit-pockets, and to enable a good heat transfer from the side walls of the block to the inner of the slit-pockets.
- The spacer sections between the slit-pockets have an optimized height and are designed for providing an optimized heat transfer to the loaded workpieces.
- A sliding door plate between the block and a housing only opens the slit-pocket where a workpiece is required to be loaded or unloaded.

Providing for a sliding door plate at least one position where all slit-pockets are closed.

Alternatively the whole block is moving in a housing and a DWHO in the housing serves as shut-off for the slit-pockets.

A method to use such a batch chamber has at least one of the following features:

In a continuous mode, so that each workpiece stays in a pocket for the same time (FIFO).

Using nitrogen or another gas to transfer heat and flush degassing material.

Allowing a minimal time for transfer of the workpiece to a vacuum load lock of a vacuum tool so as to avoid unnecessary cool down. Consequently the substrate may stay in the pocket until an empty load lock is available.

Figure 16:
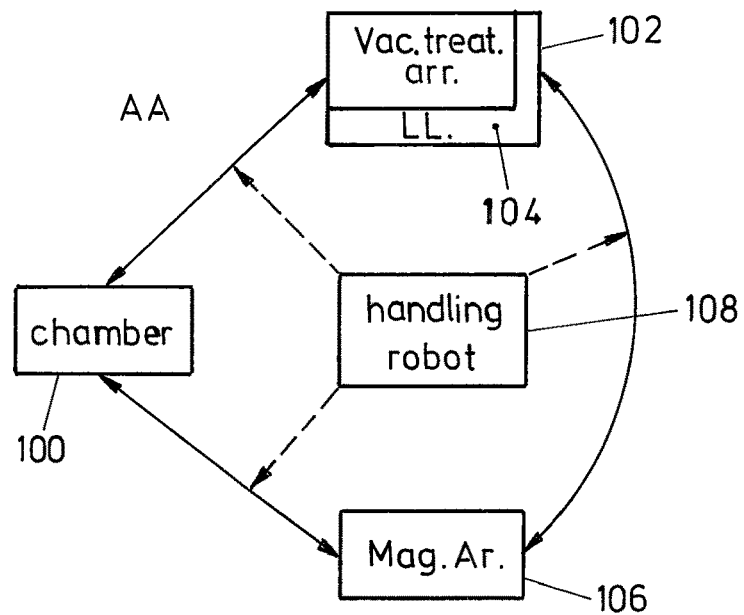
FIG. 16 shows a block-diagram representation of a system according to the invention making use of a chamber according to the invention.
Figure 17:
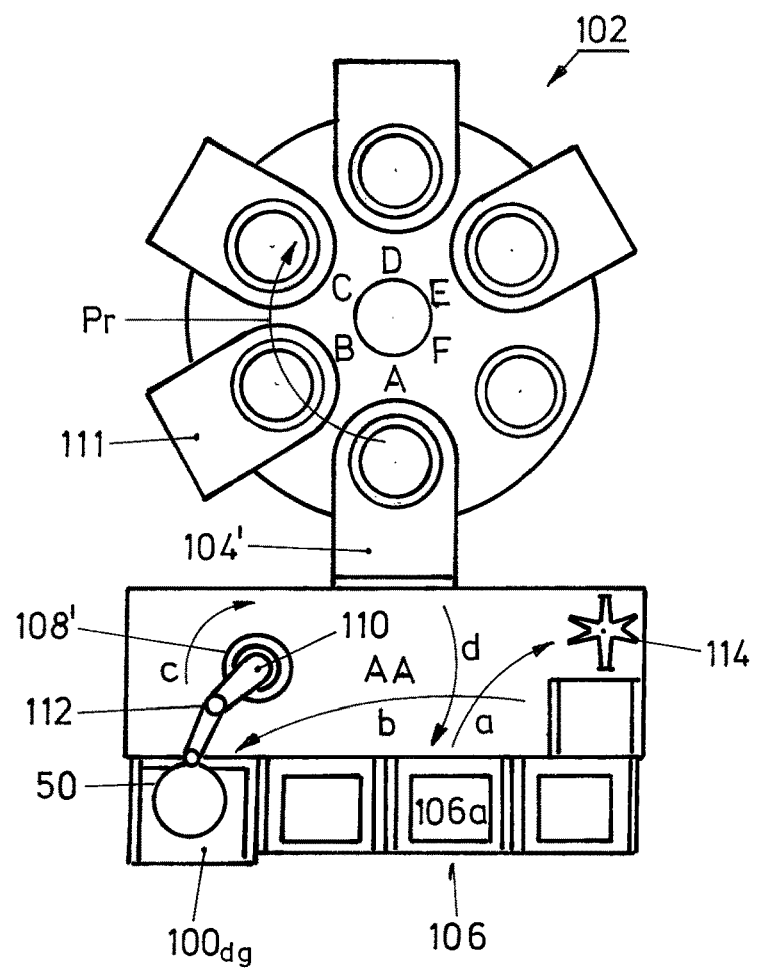
FIG. 17 shows in a schematic and simplified representation one embodiment of the system according to FIG. 16.

In FIG. 16 there is shown schematically a workpiece treatment system which makes use of the heat treatment chamber according to the invention. This chamber 100 is thereby constructed to have the following features:

a) Each slit-pocket has a single workpiece-handling opening b) The slit-pockets are stacked in aligned manner in the block in the direction perpendicular to the slit-pocket, e.g. in vertical direction as the slit-pockets are oriented normally horizontally.

c) Also the workpiece-handling opening of the slit-pockets are aligned in the addressed direction along the block without lateral displacement.

d) The door arrangement frees the inside of the slit-pockets to ambient atmosphere of the surrounding denoted in FIG. 17 by AA.

Beside of the chamber 100 according to the invention and with the addressed limitation, there is provided a vacuum treatment arrangement 102 with a load-lock arrangement 104 separating vacuum atmosphere within the vacuum treatment arrangement from ambient atmosphere AA. There is further provided a magazine arrangement 106 with at least one magazine and possibly with an aligner (not shown). The load-lock arrangement 104 comprises workpiece supports whereupon workpieces are supported parallel to workpieces on the respective supports in chamber 100. Workpieces in the magazine arrangement 106 as well are supported parallel to such workpieces in the load-lock arrangement 104 and chamber 100. In spite of the fact that these planes of workpiece support may be different planes, their mutual distance, vertical to such planes, is minimized up to all these planes forming a single plane.

There is further provided a handling robot 108 which performs workpiece handling to and from the magazine arrangement 106, possibly via a further station, e.g. an aligner station, to and from the chamber 100, to and from the vacuum treatment arrangement 102 as shown with double-arrows and dashed lines. Such a system specifically tailored for degassing, i.e. making use of the addressed chamber 100 as a degasser chamber, is shown in a schematic and simplified manner in FIG. 17.

The chamber 100 according to FIG. 16 is realized as a degasser chamber $100_{dg}$. The handling robot 108 of FIG. 16 is realized as handling robot 108' in ambient atmosphere AA and is constructed to convey single workpieces 50 to and from degasser chamber $100_{dg}$.

The vacuum treatment arrangement 102 of FIG. 16 is realized as a multi-station, single workpiece-treatment arrangement with a I/O load-lock 104' for workpiece input and output and a number of stations for single workpiece vacuum treatment. These stations may, for example, include a cooling station 111 for cooling workpieces 50 arriving from the degasser chamber $100_{dg}$, which have to be further cooled down prior to subsequent vacuum processing. The processing direction for the workpieces 50 is indicated in FIG. 17 by the arrow Pr. Beside of the input/output load-lock 104', the subsequent stations may further be etching stations, layer deposition stations as for PVD, reactive or non-reactive, for CVD plasma enhanced or non-plasma enhanced etc. as perfectly known to the skilled artisan.

The handling robot 108' which is pivotable about a vertical axis 110 and has at least one extendable and retractable handling arm 112 performs loading and unloading of the load-lock 104' by single substrates 50.

In the example as shown in FIG. 17, the magazine arrangement 106 comprises three discrete magazines and an aligner 114. The robot 108' conveys vacuum treated workpieces from load-lock 104' to an output-magazine and un-degassed workpieces from an input-magazine of the arrangement 106 to the degasser chamber $100_{dg}$.

In the specific example of FIG. 17 and for specific workpieces to be treated, there is additionally provided the aligner 114 by which the addressed workpieces 50 are geometrically aligned. Because in this specific embodiment untreated workpieces are input in a magazine $106_a$, then geometrically oriented in aligner 114 as addressed by the arrow (a) and are conveyed to the degasser chamber 100dg from the aligner 114 as shown by the arrow (b), it might be said that in fact the aligner 114 is part of the overall magazine arrangement 106. All the handling between all these stations and the chamber as provided in the system as shown, is performed solely by the robot 108'.

The approach according to such a system namely to convey workpieces to and form a chamber according to the invention, with the addressed limitations, and to and from at least two or more further stations thereby performing such conveying in ambient atmosphere, may clearly also be applied for cooling workpieces in the chamber 100 and for a large variety of other station configurations.

Figure 18:
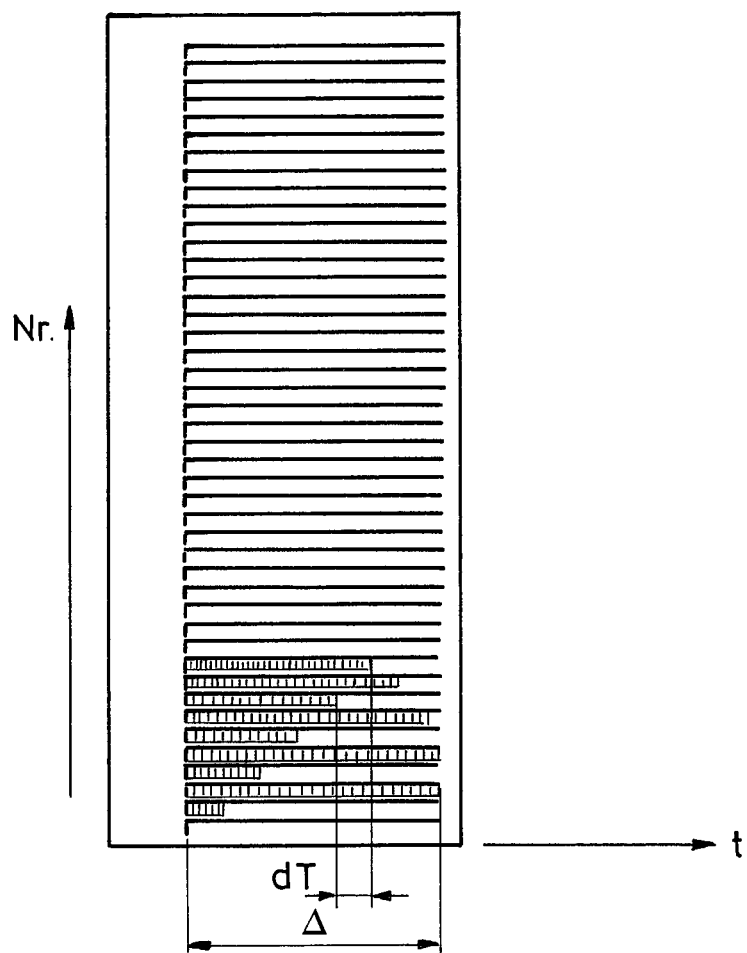
FIG. 18 shows a representation of occupation-times of the slit-pockets by workpieces at a slit-pocket staple.

FIG. 18 depicts along a horizontal axis addressed with t the occupation time of 44 stacked slit-pockets by workpieces. The vertical axis addresses the number of the slit-pockets piled one above the other.

As may be seen in processing of the chamber, with a member n of slit-pocket, here n=44, only a minor number m, here m=10, of slit-pockets is exploited. This results from the fact that the workpieces, which are treated in this example necessitate a predetermined heat treating time Δ, and the workpieces are loaded in respective slit-pockets of the chamber subsequently with a time lag dT.

The number m of used slit-pockets in the chamber may be determined by forming the quotient of Δ/dT rounded to an integer. Thus, after the m of slit-pockets have been loaded with a time lag of dT, the timespan Δ for treatment of the workpiece which was first loaded, is lapsed and such workpiece may be unloaded from the respective slit-pocket. As apparent from the processing according to FIG. 17, the timespan dT which staggers subsequent loading operations to the chamber is in fact to be determined primarily by the throughput rate of the vacuum treatment arrangement 102.

As may further be seen in FIG. 18, representing in fact operation especially of the system according to FIG. 17, loading operation of workpieces to the chamber 100 is not subsequently performed in directly neighboring slit-pockets. As shown in FIG. 18 as an example, loading is performed in every second slit-pocket. Thus, and as seen from the occupation timespans according to the blackened columns in FIG. 18 during which a workpieces stay in the respective slit-pockets, loading according to the processing of FIG. 18 has occurred in the sequence of slit-pocket numbers:

3, 5, 7, 9, 10, 8, 6, 4, 2, 1.

Unloading is, according to FIG. 18 performed in the following sequence:

3, 5, 7, 9, 10, 8, 6, 4, 2, 1.

Consequently every slit-pocket may be unloaded from and immediately reloaded with a workpiece before propagating to unloading and loading the next slit-pocket in the sequence.

Loading and unloading not directly neighboring slit-pockets has the advantage that, the directly neighboring slit-pockets are significantly less affected by thermal disturbances as caused by the loading/unloading action.

Although the processing as shown in FIG. 18 is specifically exploited with the system as shown in FIG. 17, it may also be exploited in appropriate, different overall systems with the chamber of staggered slit-pockets according to the invention.

What is claimed is:

1. A heater or cooler chamber for a batch of more than one workpiece, which are sheet-shaped, drum-skin like shaped in a frame, band-shaped or plate-shaped, wherein each shape has a pair of two-dimensionally extended surfaces and a thickness D of $$1.01\ mm < D < 5\ mm,$$

comprising:
a heat storage block made of one single metal piece or of more than one narrowly coupled metal parts, with respect to heat transfer and thermally behaving commonly in a manner only negligibly different from said equal single piece metal block or chunk;
said block comprising more than one slit-pocket stacked one upon the other in a first direction, each dimensioned to accommodate a single workpiece therein and extending along a slit-pocket plane, said block further comprising an outward-facing side surface extending parallel to the first direction;
in each of said slit-pockets a workpiece support for a workpiece;
each slit-pocket having at least one workpiece handling opening;
each slit-pocket having inner surfaces configured to surround said single workpiece when said single workpiece is positioned on said workpiece support, wherein each of said inner surfaces is spaced from and does not contact said single workpiece, a height h of each of said slit-pockets perpendicular to said slit-pocket plane and along not less than 30% of an extent surface area of said slit-pockets, considered parallel to said slit-pocket plane being:

$$2.5\ mm < h < 50\ mm$$

the at least one workpiece handling openings of said slit-pockets being operatively connected to a door that controls the freeing and covering of the respective workpiece handling openings with respect to an atmosphere outside said block;
a heating arrangement or a cooling arrangement extending in the first direction along said outward-facing side surface of the block, said outward-facing side surface defining a heater interface or a cooler interface that traverses each of said slit-pocket planes, wherein said heating arrangement or cooling arrangement is configured to engage said heater interface or cooler interface and traverse each of said slit-pocket planes so that all said slit-pockets are simultaneously heated or cooled by said heating arrangement or said cooling arrangement when heating or cooling is applied by said heating arrangement or said cooling arrangement to said heater interface or cooler interface, wherein heat transfer between said heater interface or cooler interface and an interior of said slit-pockets occurs only through said inner surfaces of said slit-pockets.

2. The chamber of claim 1 comprising a gas feed line arrangement dispatching in at least some of said slit-pockets or in all of said slit-pockets.

3. The chamber of claim 1 at least some or all of said slit-pockets being substantially gas-tight when the respective workpiece handling opening is covered by said door or at least some or all of said pockets comprising then a gas outlet.

4. The chamber of claim 1 at least some or all of said slit-pockets being aligned and stacked in said block in said first direction perpendicular to said slit-pocket planes.

5. The chamber of claim 1 at least some or all of said at least one workpiece handling openings of said slit-pockets being aligned in said first direction perpendicular to said slit-pocket planes.

6. The chamber according to claim 1 wherein at least some or all of neighboring slit-pockets are thermally substantially decoupled.

7. The chamber according to claim 6 wherein said slit-pockets are aligned in the first direction perpendicular to said slit-pocket planes and neighboring slit-pockets are separated perpendicularly to said slit-pocket planes by sections of said block having a thickness d considered in direction perpendicular to said slit-pocket planes of $$0.5\ mm < d < 10\ mm$$

and along not less than 30% of the extent surface area of said slit-pockets, considered parallel to said slit-pocket planes.

8. The chamber according to claim 1 said slit pockets comprising each in a bottom surface thereof, one or more than one handler-cutouts, realized, at least in part, by through cutouts, accessible through said at least one workpiece handling opening, for introducing and removing at least one handling arm of a workpiece handler robot and below a workpiece on the workpiece support.

9. The chamber according to claim 1 at least some or all of said slit-pockets comprising one single workpiece-handling opening.

10. The chamber according to claim 1 said door being controllable to cover and free at least one of said workpiece handling openings at the same time, or of more than one of said workpiece handling openings simultaneously.

11. The chamber according to claim 1 said door being controllable to maintain all workpiece handling openings in covered status simultaneously during a time span.

12. The chamber according to claim 1 wherein at least some or all of the at least one workpiece handling openings are mutually aligned in one direction and said door comprises a door-plate with at least one door-workpiece-handling opening, said door-plate being controllably slidable along and relative to said block in said direction so as to selectively bring said at least one door-workpiece-handling opening in and out of alignment with at least one of said workpiece-handling openings of said slit-pockets.

13. The chamber of claim 12 wherein said door-plate is operationally connected to a plate-drive for said relative sliding.

14. The chamber of claim 12 wherein said block is operationally connected to a block-drive for said relative sliding.

15. The chamber of claim 12 wherein said door-plate is realized by a wall of a housing around said heat storage block.

16. The chamber of claim 12 wherein said door-plate is realized by a wall of a housing around said heat storage block and said heat storage block is operationally connected to a block-drive for said relative sliding.

17. The chamber of claim 1 wherein said heat storage block comprises two outward-facing side surfaces and a front face, said two outward-facing side surfaces each defining said heater interface or said cooler interface, said at least one workpiece handling openings of said slit-pockets are provided in said front face.

18. The chamber of claim 17 comprising a gas feed line dispatching in at least some of said slit-pockets or in all of said slit-pockets said gas feed line being operationally thermally connected to a gas heater or cooler arrangement along a back face of said block opposite said front face.

19. The chamber of claim 17 wherein said slit-pockets extend transverse or perpendicularly to said side faces.

20. The chamber of claim 1 wherein said block is mounted within a thermally isolating housing.

21. The chamber of claim 20 wherein said door comprises one or more than one controllable door-workpiece-handling opening in a wall of said isolating housing opposite said workpiece handling openings and said block is operatively coupled to a controllable block drive constructed to bring one more than one of said workpiece handling openings into alignment with one or respectively more than one of said controllable openings.

22. The chamber of claim 20, said controllable door workpiece-handling openings being equipped with a controllably driven flap or slider.

23. The chamber of claim 1 said block being contoured to define said slit-pockets integrally formed within said block.

24. The chamber of claim 1 comprising a gas feed line arrangement dispatching in at least some of said slit-pockets or in all of said slit-pockets wherein said gas feed line arrangement comprises gas feed lines through said heat storage block and dispatching respectively into at least some of the pockets and dispatching into the pockets opposite the at least one workpiece handling opening of the respective pockets and directed towards said at least one workpiece handling opening.

25. The chamber of claim 1 wherein said workpiece handling openings are ongoingly in flow communication with an interspace between said heat storage block and an isolating housing.

26. The chamber of claim 25 said housing comprising a pump port abutting in said interspace.

27. The chamber of claim 1 being one of a heater chamber, a cooler chamber, a cooler or heater chamber, or a degasser chamber.

28. A workpiece treatment system comprising a chamber according to claim 1, wherein
a) said slit pocket planes are horizontal;
b) the door frees the inside of the slit-pockets to ambient atmosphere;
and further comprising:
a vacuum treatment arrangement for the workpieces comprising a load-lock arrangement between said ambient atmosphere and a treatment space in said vacuum treatment arrangement;
a magazine arrangement, comprising at least one magazine in said ambient atmosphere and with a multitude of workpiece holders;
wherein said workpiece holders of said magazine arrangement and a workpiece holder arrangement in said load-lock arrangement are tailored to hold the workpieces with their extended surfaces along parallel planes;
a handling robot in said ambient atmosphere, drivingly rotatable about a vertical axis and having at least one radially extendable and retractable handling arm for at least one workpiece;
wherein said handling robot is tailored to handle workpieces to and from said magazine arrangement, to and from said load-lock arrangement, to and from said slit-pockets.

29. The system of claim 28 further comprising a workpiece aligner station also served by said handling robot.

30. The chamber of claim 1, wherein said heat storage block comprises two outward-facing, opposite side surfaces each defining said heater interface or said cooler interface.

31. The chamber according to claim 1, wherein the heating arrangement or the cooling arrangement includes a plurality of separate elements that are spaced apart in a direction perpendicular to the first direction.

32. A heater or cooler chamber for a batch of more than one workpiece, which are sheet-shaped, drum skin-like shaped in a frame, band-shaped or plate-shaped, wherein each shape has a pair of two-dimensionally extended surfaces and a thickness D of $$0.01 \text{ mm} < D < 5 \text{ mm},$$

comprising:
a heat storage block made of one single metal piece or of more than one metal parts, narrowly coupled with respect to heat transfer and thermally behaving commonly in a manner only negligibly different from said equal single piece metal block or chunk;
said block comprising more than one slit-pocket stacked one upon the other, each dimensioned to accommodate a single workpiece therein and extending along a slit-pocket plane;
in each of said slit-pockets a workpiece support for a workpiece;
each slit-pocket having at least one workpiece handling opening;
each slit-pocket having inner surfaces configured to surround said single workpiece when said single workpiece is positioned on said workpiece support, wherein each of said inner surfaces is spaced from and does not contact said single workpiece, a height h of each of said slit-pocket perpendicular to said slit-pocket plane and along not less than 30% of an extent surface area of said slit-pockets, considered parallel to said slit-pocket plane being:

$$2.5 \text{ mm} < h < 50 \text{ mm}$$

the at least one workpiece handling openings of said slit-pockets being operatively connected to a door that controls the freeing and covering of the respective workpiece handling openings with respect to an atmosphere outside said block;
a heater or cooler interface arrangement extending along an outward-facing side surface of the block in a direction perpendicular to said slit-pocket planes, said outward-facing side surface defining a heater interface or a cooler interface that traverses each of said slit-pockets, wherein said heater or cooler interface arrangement is configured to engage said heater interface or cooler interface and traverse each of said slit-pockets so that all said slit-pockets are simultaneously heated or cooled by said heater or cooler interface arrangement when heating or cooling is applied by said heater or cooler interface arrangement to said heater interface or cooler interface, wherein heat transfer between said heater interface or cooler interface and an interior of said slit-pockets occurs only through said inner surfaces of said slit-pockets; and a gas feed line arrangement dispatching in at least some of said slit-pockets or in all of said slit-pockets wherein said gas feed line arrangement comprises gas feed lines through said heat storage block and dispatching respectively into at least some of the pockets and dispatching into the pockets opposite the at least one workpiece handling opening of the respective pockets and directed towards said at least one workpiece handling opening.

33. The chamber according to claim 32, wherein the heating arrangement or the cooling arrangement includes a plurality of separate elements that are spaced apart in a direction parallel to the slit-pocket plane.

\* \* \* \* \*